(12) United States Patent
Umemoto et al.

(10) Patent No.: US 10,777,669 B2
(45) Date of Patent: Sep. 15, 2020

(54) HETEROJUNCTION BIPOLAR TRANSISTOR

(71) Applicant: Murata Manufacturing Co., Ltd., Kyoto-fu (JP)

(72) Inventors: Yasunari Umemoto, Nagaokakyo (JP); Shigeki Koya, Nagaokakyo (JP); Isao Obu, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 54 days.

(21) Appl. No.: 16/152,285

(22) Filed: Oct. 4, 2018

(65) Prior Publication Data

US 2019/0115457 A1 Apr. 18, 2019

(30) Foreign Application Priority Data

Oct. 13, 2017 (JP) .................. 2017-199029

(51) Int. Cl.
| | |
|---|---|
| *H01L 29/737* | (2006.01) |
| *H01L 29/205* | (2006.01) |
| *H01L 29/08* | (2006.01) |
| *H01L 29/10* | (2006.01) |
| *H01L 29/66* | (2006.01) |
| *H01L 21/285* | (2006.01) |
| *H01L 21/308* | (2006.01) |
| *H01L 21/306* | (2006.01) |
| *H03F 3/21* | (2006.01) |

(52) U.S. Cl.
CPC .... *H01L 29/7371* (2013.01); *H01L 21/28575* (2013.01); *H01L 21/308* (2013.01); *H01L 21/30612* (2013.01); *H01L 29/0821* (2013.01); *H01L 29/1004* (2013.01); *H01L 29/205* (2013.01); *H01L 29/66318* (2013.01); *H01L 29/0817* (2013.01); *H01L 29/0826* (2013.01); *H03F 3/21* (2013.01)

(58) Field of Classification Search
None
See application file for complete search history.

(56) References Cited

U.S. PATENT DOCUMENTS

| | | | |
|---|---|---|---|
| 5,631,477 A | 5/1997 | Streit et al. | |
| 6,992,337 B2 * | 1/2006 | Bahl | H01L 29/0821 |
| | | | 257/194 |

FOREIGN PATENT DOCUMENTS

| | | |
|---|---|---|
| JP | S64-59957 A | 3/1989 |
| JP | 2000-332023 A | 11/2000 |
| JP | 2004-214576 A | 7/2004 |

* cited by examiner

Primary Examiner — Robert K Carpenter
(74) *Attorney, Agent, or Firm* — Studebaker & Brackett PC

(57) ABSTRACT

A heterojunction bipolar transistor includes a collector layer, a base layer, and an emitter layer that are stacked on a substrate. The collector layer includes a graded semiconductor layer in which an electron affinity increases from a side closer to the base layer toward a side farther from the base layer. An electron affinity of the base layer at an interface closer to the collector layer is equal to an electron affinity of the graded semiconductor layer at an interface closer to the base layer.

17 Claims, 14 Drawing Sheets

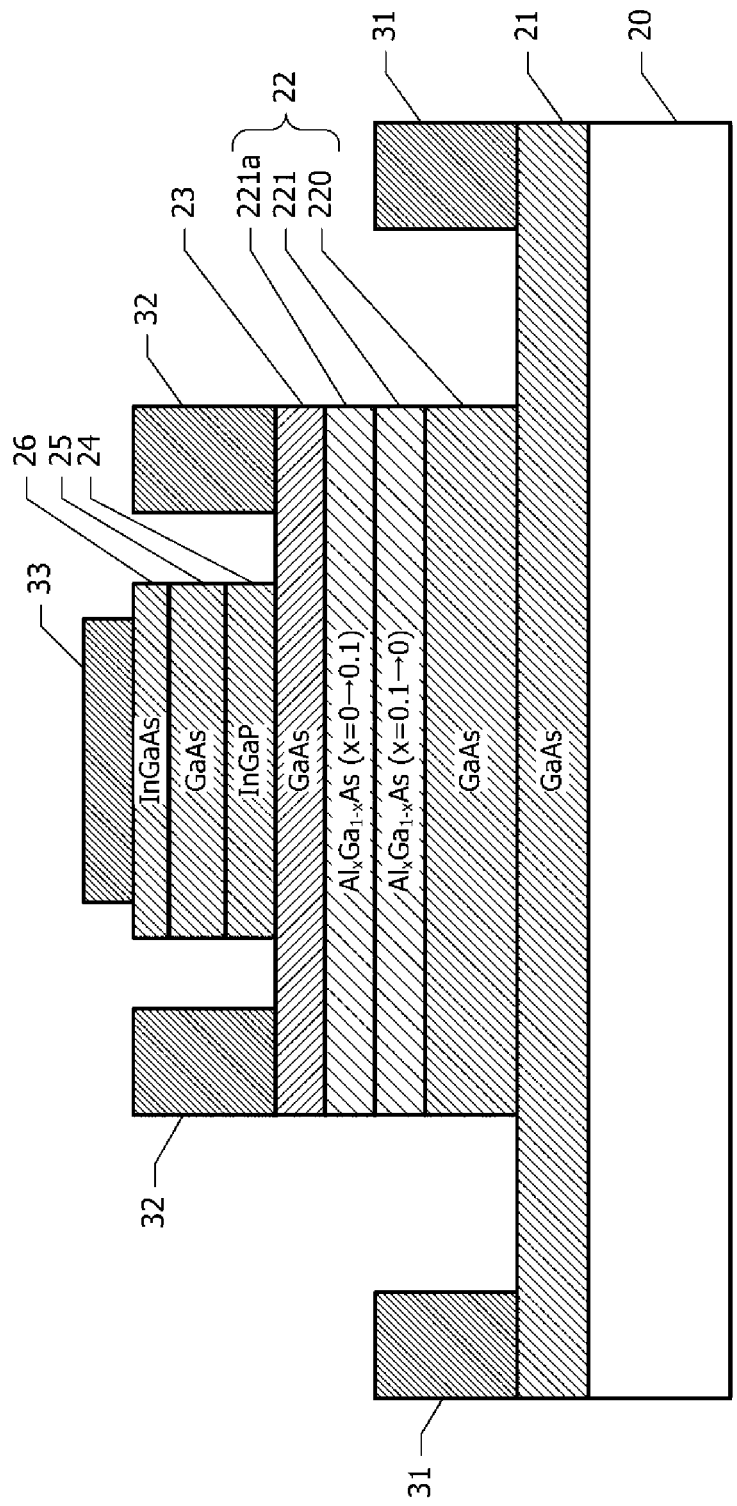

HETEROJUNCTION BIPOLAR TRANSISTOR

CROSS-REFERENCE TO RELATED APPLICATION

This application claims benefit of priority to Japanese Patent Application No. 2017-199029, filed Oct. 13, 2017, the entire content of which is incorporated herein by reference.

BACKGROUND

Technical Field

The present disclosure relates to a heterojunction bipolar transistor.

Background Art

In mobile terminals, heterojunction bipolar transistors (HBTs) are mainly used as transistors included in power amplifier modules. Examples of characteristics required for HBTs include high efficiency, high gain, high output, high breakdown voltage, and low distortion in the radio-frequency range. In particular, recently, low distortion and high performance (high efficiency and high gain) have been desired for HBTs that are operated at high output.

Japanese Unexamined Patent Application Publication No. 2000-332023 discloses an HBT aiming the achievement of high efficiency. The HBT includes an emitter layer, a base layer, a collector layer, and a sub-collector layer in this order. The collector layer includes a plurality of adjacent sub-regions. In each of the sub-regions, the energy band gap is constant or changes linearly. The energy band edge in which carriers in the collector transit is continuous between the adjacent sub-regions. A two-dimensional or quasi-two-dimensional charge layer is formed at the interfaces between the sub-regions so as to compensate for a quasi-electric field resulting from the difference in electron affinity and energy band gap between the sub-regions.

One of the sub-regions of the collector layer is formed of a graded semiconductor in which the electron affinity gradually increases from the base layer toward the sub-collector layer. A sub-region formed of an inversely graded semiconductor in which the electron affinity gradually decreases from the base layer toward the sub-collector layer (inversely graded semiconductor layer) is disposed between the sub-region (graded semiconductor layer) and the base layer. A two-dimensional charge layer (delta-doped layer) is disposed at an interface between the graded semiconductor layer and the inversely graded semiconductor layer. Herein, the term "graded semiconductor layer" refers to a semiconductor layer in which a mixed-crystal ratio of constituent elements of an alloy semiconductor (mixed-crystal semiconductor) changes such that the electron affinity gradually increases from the base layer toward the sub-collector layer. The term "inversely graded semiconductor layer" refers to a semiconductor layer in which a mixed-crystal ratio of constituent elements of an alloy semiconductor changes such that the electron affinity gradually decreases from the base layer toward the sub-collector layer.

This HBT includes a heterojunction between the collector layer and the base layer and is classified into a so-called double heterojunction bipolar transistor (DHBT). In DHBTs, an improvement in the efficiency of a power amplifier is expected by reducing the offset voltage.

In DHBTs, although an improvement in the efficiency can be expected by reducing the offset voltage, inhibition of electron transport called blocking effect is caused by an energy barrier formed at an interface between an inversely graded semiconductor layer and a graded semiconductor layer. The effect of improving the efficiency of DHBTs may not be effectively achieved due to this blocking effect. In the DHBT disclosed in Japanese Unexamined Patent Application Publication No. 2000-332023, the energy barrier is lowered by disposing the delta-doped layer at the interface between the inversely graded semiconductor layer and the graded semiconductor layer to thereby improve the efficiency.

SUMMARY

According to examinations conducted by the inventors of the present application, it was found that in the structure of the DHBT disclosed in Japanese Unexamined Patent Application Publication No. 2000-332023, the linearity of input-output characteristics decreases (distortion increases) at high output. The reason why the linearity of input-output characteristics decreases at high output is as follows.

In the HBT disclosed in Japanese Unexamined Patent Application Publication No. 2000-332023, the arrangement of the delta-doped layer causes the presence of a high-concentration region in the collector layer near the base layer. This high-concentration region may cause a decrease in the linearity of the voltage dependence of the base-collector capacitance (Cbc-Vbc characteristics). The decrease in the linearity of Cbc-Vbc characteristics results in degradation of an adjacent channel leakage ratio (ACLR), which is an index representing the distortion of power amplifiers.

Accordingly, the present disclosure provides an HBT capable of suppressing a decrease in the linearity of input-output characteristics thereof.

A heterojunction bipolar transistor according to a first aspect of the present disclosure includes a collector layer, a base layer, and an emitter layer that are stacked on a substrate. The collector layer includes a graded semiconductor layer in which an electron affinity increases from a side closer to the base layer toward a side farther from the base layer. An electron affinity of the base layer at an interface closer to the collector layer is equal to an electron affinity of the graded semiconductor layer at an interface closer to the base layer.

An energy barrier to electrons is not formed at an interface between the base layer and the collector layer. An energy barrier to electrons is not formed in the graded semiconductor layer of the collector layer. This configuration enables a decrease in the cutoff frequency due to the blocking effect to be suppressed. Furthermore, a high-concentration layer such as a delta-doped layer need not be disposed in the collector layer on the side closer to the base layer. This configuration enables a decrease in the linearity of input-output characteristics to be suppressed.

A heterojunction bipolar transistor according to a second aspect of the present disclosure has the configuration of the heterojunction bipolar transistor according to the first aspect, wherein an electron affinity of the base layer increases from an interface closer to the emitter layer toward the interface closer to the collector layer. Electrons are drifted by an effective electric field generated in the base layer, and thus radio-frequency characteristics and the ACLR can be further improved.

A heterojunction bipolar transistor according to a third aspect of the present disclosure has the configuration of the heterojunction bipolar transistor according to the second aspect, wherein the base layer is made of AlGaAs, and an AlAs mixed-crystal ratio of the base layer decreases from the interface closer to the emitter layer toward the interface closer to the collector layer. When the AlAs mixed-crystal ratio is changed in this manner, the electron affinity of the base layer increases from the interface closer to the emitter layer toward the interface closer to the collector layer.

A heterojunction bipolar transistor according to a fourth aspect of the present disclosure has the configuration of the heterojunction bipolar transistor according to any of the first to third aspects, wherein the collector layer includes a first portion which is a portion closer to the base layer and a second portion which is a remaining portion farther from the base layer. Also, a doping concentration of the first portion is lower than a doping concentration of the second portion.

With an increase in the collector voltage, a depletion layer rapidly extends from the base-collector interface toward the collector layer. When the depletion layer reaches an interface between the first portion and the second portion, the extension of the depletion layer is suppressed with respect to the increase in the collector voltage. Since the collector voltage dependence of the base-collector capacitance is decreased in a collector voltage region in which the extension of the depletion layer is suppressed, the linearity of input-output characteristics can be enhanced.

A heterojunction bipolar transistor according to a fifth aspect of the present disclosure has the configuration of the heterojunction bipolar transistor according to the fourth aspect, wherein the first portion is made of at least one semiconductor selected from the group consisting of n-type semiconductors having a doping concentration of $3 \times 10^{15}$ cm$^{-3}$ or less, p-type semiconductors having a doping concentration of $1 \times 10^{15}$ cm$^{-3}$ or less, and intrinsic semiconductors. With an increase in the collector voltage, the depletion layer extending from the base-collector interface toward the collector layer more rapidly reaches the interface between the first portion and the second portion.

A heterojunction bipolar transistor according to a sixth aspect of the present disclosure has the configuration of the heterojunction bipolar transistor according to the fourth aspect or the fifth aspect, wherein the second portion includes a third portion which is a portion closer to the first portion and a fourth portion which is a remaining portion farther from the first portion. Also, a doping concentration of the third portion is lower than a doping concentration of the fourth portion.

When the first portion and the third portion each have a lower concentration than the fourth portion, the base-collector breakdown voltage and the emitter-collector breakdown voltage can be enhanced. Thus, higher output of a power amplifier including a heterojunction bipolar transistor can be realized.

A heterojunction bipolar transistor according to a seventh aspect of the present disclosure has the configuration of the heterojunction bipolar transistor according to the sixth aspect and further includes a sub-collector layer made of an n-type semiconductor, disposed on the substrate, and functioning as a path through which a current flows into the collector layer. The collector layer is disposed on the sub-collector layer, and each of the doping concentrations of the first portion and the third portion is 1/10 or less of a doping concentration of the sub-collector layer. A sufficient effect of enhancing the base-collector breakdown voltage and the emitter-collector breakdown voltage is obtained.

A heterojunction bipolar transistor according to an eighth aspect of the present disclosure has the configuration of the heterojunction bipolar transistor according to the seventh aspect, wherein the doping concentration of the fourth portion is 0.5 times or more and 1.5 times or less (i.e., from 0.5 time to 1.5 times) the doping concentration of the sub-collector layer.

The collector resistance can be reduced. As a result, higher output and an improvement in the efficiency of a power amplifier including a heterojunction bipolar transistor can be realized.

An energy barrier to electrons is not formed at the interface between the base layer and the collector layer. An energy barrier to electrons is not formed in the graded semiconductor layer of the collector layer. This configuration enables a decrease in the cutoff frequency due to the blocking effect to be suppressed. Furthermore, a high-concentration layer such as a delta-doped layer need not be disposed in the collector layer on the side closer to the base layer. This configuration enables a decrease in the linearity of input-output characteristics to be suppressed.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 2 is a sectional view of an HBT according to a comparative example having a structure similar to the HBT disclosed in Japanese Unexamined Patent Application Publication No. 2000-332023;

DETAILED DESCRIPTION

First Embodiment

An HBT according to a first embodiment will be described with reference to FIGS. 1 to 3B.

Figure 1:
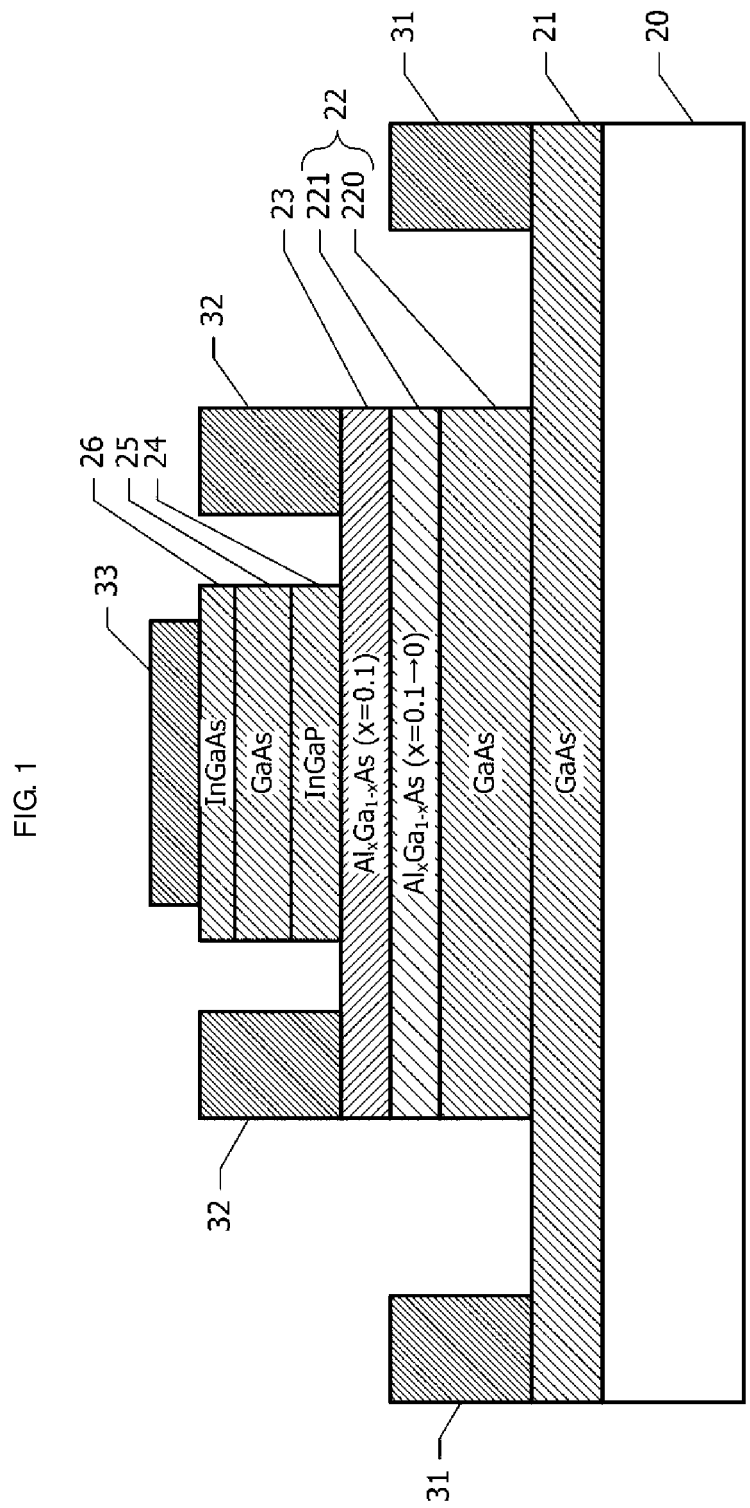
FIG. 1 is a sectional view of an HBT according to a first embodiment.

FIG. 1 is a sectional view of an HBT according to the first embodiment. A sub-collector layer 21 made of n-type GaAs is disposed on a substrate 20 made of semi-insulating GaAs. A collector layer 22 and a base layer 23 are stacked on a partial region of the sub-collector layer 21.

The collector layer 22 includes two layers of a lower collector layer 220 disposed on the side closer to the sub-collector layer 21 and an upper collector layer 221 disposed on the lower collector layer 220. The lower collector layer 220 is made of n-type GaAs. The upper collector layer 221 is made of n-type $Al_xGa_{1-x}As$. The upper collector layer 221 is a graded semiconductor layer in which an AlAs mixed-crystal ratio x linearly changes from 0.1 at the interface closer to the base layer 23 to 0 at the interface closer to the sub-collector layer 21. In the graded semiconductor layer, the electron affinity gradually increases from the side closer to the base layer 23 toward the side farther from the base layer 23.

The base layer 23 is made of p-type $Al_xGa_{1-x}As$. The AlAs mixed-crystal ratio x of the base layer 23 is 0.1. The electron affinity of the base layer 23 is equal to the electron affinity of the upper collector layer 221 at the interface on the base side. Note that even when there is a difference of about 26 meV, which is energy of an electron at room temperature, between the electron affinities, such a relationship between the electron affinities is substantially classified into the category that "electron affinities are equal to each other".

An emitter layer 24, an emitter cap layer 25, and an emitter contact layer 26 are stacked on a partial region of the base layer 23. The emitter layer 24 is made of n-type InGaP. The emitter cap layer 25 is made of n-type GaAs. The emitter contact layer 26 is made of n-type InGaAs.

A collector electrode 31 is disposed on the sub-collector layer 21. A base electrode 32 is disposed on the base layer 23. An emitter electrode 33 is disposed on the emitter contact layer 26. The collector electrode 31 is in ohmic contact with the sub-collector layer 21. The base electrode 32 is in ohmic contact with the base layer 23. The emitter electrode 33 is in ohmic contact with the emitter layer 24 with the emitter contact layer 26 and the emitter cap layer 25 therebetween. The sub-collector layer 21 functions as a path through which a current flows into the collector layer 22.

FIG. 2 is a sectional view of an HBT according to a comparative example having a structure similar to the HBT disclosed in Japanese Unexamined Patent Application Publication No. 2000-332023. Hereinafter, the difference from the HBT according to the first embodiment illustrated in FIG. 1 will be described.

In the comparative example, a base layer 23 is made of GaAs. In order to avoid discontinuity of the potential at the lower edge of the conduction band at the interface between the base layer 23 and a collector layer 22, an inversely graded semiconductor layer 221a is disposed between an upper collector layer 221 and the base layer 23. The inversely graded semiconductor layer 221a is made of n-type $Al_xGa_{1-x}As$. The AlAs mixed-crystal ratio x of the inversely graded semiconductor layer 221a linearly changes from 0 at the interface closer to the base layer 23 to 0.1 at the interface closer to a sub-collector layer 21. No delta-doped layer is disposed at the interface between the inversely graded semiconductor layer 221a and the upper collector layer 221. The reason why no delta-doped layer is disposed is to suppress a decrease in the linearity of the voltage dependence of the base-collector capacitance Cbc.

The collector current dependence of a cutoff frequency ft of the HBT according to the first embodiment illustrated in FIG. 1 and the HBT according to the comparative example illustrated in FIG. 2 were determined by a simulation.

Figure 3A:
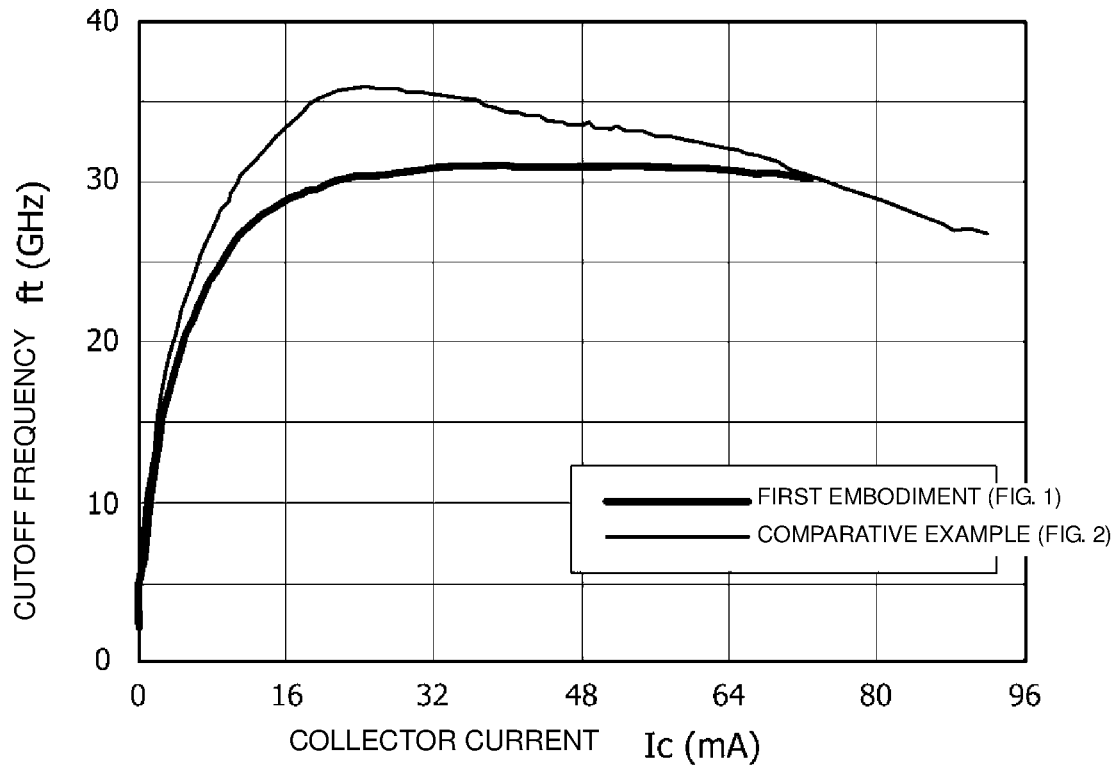
FIG. 3A is a graph showing simulation results of the collector current dependence of a cutoff frequency ft (ft-Ic characteristics)

FIG. 3A is a graph showing the simulation results of the collector current dependence of the cutoff frequency ft (ft-Ic characteristics). The horizontal axis represents a collector current Ic in units of "mA", and the vertical axis represents the cutoff frequency ft in units of "GHz". The thick solid line and the thin solid line in FIG. 3A indicate the cutoff frequency ft of the HBT of the first embodiment (FIG. 1) and the HBT of the comparative example (FIG. 2), respectively. For example, the range of use of the collector current Ic is 80 mA or less.

In the case of the comparative example, in the typical range of use of the collector current Ic, the cutoff frequency ft increases with an increase in the collector current Ic, exhibits a peak (maximum value), and then decreases. In the comparative example, as described above, no delta-doped layer is disposed at the interface between the inversely graded semiconductor layer 221a and the upper collector layer 221 to thereby suppress a decrease in the linearity of the voltage dependence of the base-collector capacitance Cbc, thus improving the ACLR. However, since flatness of the ft-Ic characteristics is impaired in high-output operation, the effect of the improvement in the ACLR is reduced.

In the case of the HBT according to the first embodiment, the ft-Ic characteristics are substantially flat in the range of a collector current Ic of 16 mA or more and 80 mA or less (i.e., from 16 mA to 80 mA). Therefore, the effect of the improvement in the ACLR is not reduced even in high-output operation.

Next, the reason why flatness of the ft-Ic characteristics of the HBT according to the comparative example is impaired will be described with reference to FIG. 3B.

Figure 3B:
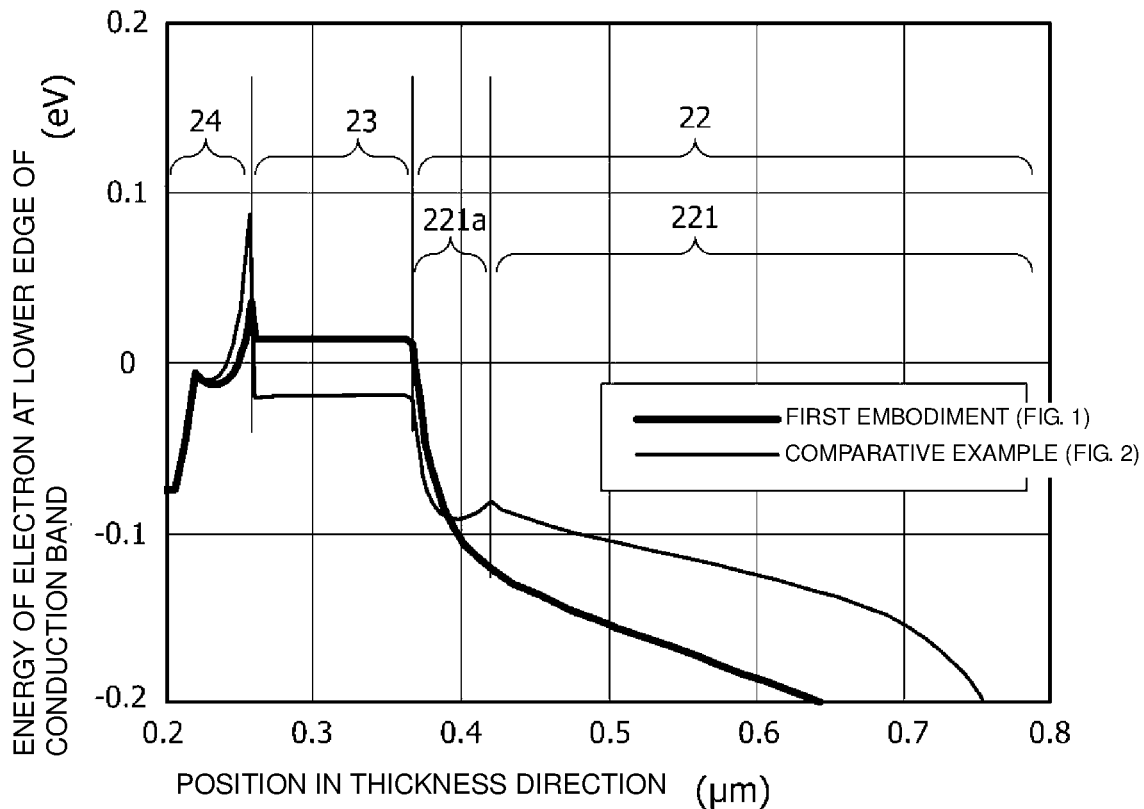
FIG. 3B is a graph showing simulation results of energy of an electron at the lower edge of the conduction band of an HBT when an emitter voltage is 0 V, and a base voltage and a collector voltage are 1.3 V.

FIG. 3B is a graph showing simulation results of energy of an electron at the lower edge of the conduction band of an HBT when an emitter voltage is 0 V, and a base voltage and a collector voltage are 1.3 V. The horizontal axis represents a position of an HBT in a thickness direction in units of "μm", and the vertical axis represents energy of an electron at the lower edge of the conduction band in units of "eV". The thick solid line and the thin solid line in FIG. 3B indicate energy of an electron at the lower edge of the conduction band of an HBT according to the first embodiment (FIG. 1) and an HBT according to the comparative example (FIG. 2), respectively.

In the case of the comparative example, an energy barrier to the electron at the lower edge of the conduction band is formed at the interface between the inversely graded semiconductor layer 221a and the upper collector layer 221. When the base voltage Vbe is increased to increase the collector current Ic, the energy barrier to electrons that move from base-collector interface toward the sub-collector layer 21 (FIG. 2) is relatively increased. As a result, the blocking effect becomes significant, and the amount of electrons accumulated in the inversely graded semiconductor layer 221a increases. Since the amount of electrons accumulated increases with an increase in the collector current Ic, the cutoff frequency ft gradually decreases with the increase in the collector current Ic.

In the case of the first embodiment, the collector layer 22 does not include the inversely graded semiconductor layer 221a, and the upper collector layer 221 (FIG. 1), which is a graded semiconductor layer, is in contact with the base layer 23. On both sides of the base-collector interface, the electron affinity of the base layer 23 and the electron affinity of the collector layer 22 are equal to each other, and an energy barrier to electrons is not formed. Furthermore, since the inversely graded semiconductor layer 221a is not included in the collector layer 22, an energy barrier to electrons is not formed also in the collector layer 22. Therefore, the blocking effect does not occur. Thus, a decrease in the cutoff frequency ft in a high-current region is prevented, and the ft-Ic characteristics are substantially flat.

Next, advantageous effects of the HBT according to the first embodiment will be described. In the HBT according to the first embodiment, an interface between an inversely graded semiconductor layer and a graded semiconductor layer is not present in the collector layer 22. Therefore, it is not necessary to dispose a delta-doped layer for decreasing an energy barrier formed at the interface between the inversely graded semiconductor layer and the graded semiconductor layer. Since a high-concentration layer such as a delta-doped layer is not disposed in the vicinity of the base-collector interface, the linearity of the voltage dependence of the base-collector capacitance Cbc can be ensured. As a result, an improvement in the ACLR can be realized.

Furthermore, since the blocking effect does not occur in the HBT according to the first embodiment, flatness of the ft-Ic characteristics can be ensured. As a result, a reduction in the effect of improving the ACLR can be prevented.

In the first embodiment, an improvement in the ACLR can be realized, and a reduction in the effect of improving the ACLR can be prevented. Thus, the ACLR can be improved in high-output operation. In the case where the ACLR is fixed, the efficiency of the HBT can be improved.

Second Embodiment

Next, an HBT according to a second embodiment will be described with reference to FIGS. 4 to 8. Hereinafter, descriptions of configurations that are common to those of the HBT (FIG. 1) according to the first embodiment will be omitted.

Figure 4:
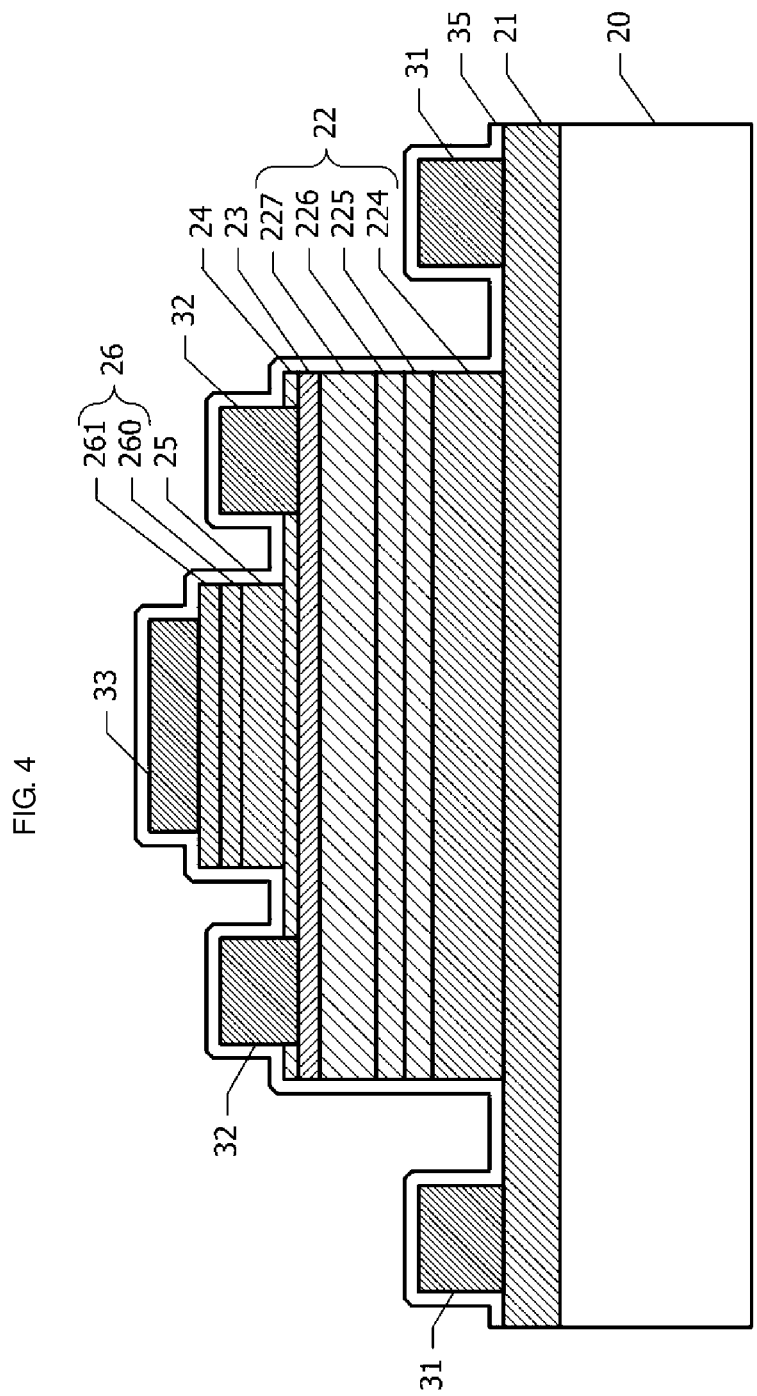
FIG. 4 is a sectional view of an HBT according to a second embodiment.

FIG. 4 is a sectional view of an HBT according to the second embodiment. A sub-collector layer 21 is made of n-type GaAs having a Si concentration of $2\times10^{18}$ cm$^{-3}$ or more and $6\times10^{18}$ cm$^{-3}$ or less (i.e., from $2\times10^{18}$ cm$^{-3}$ to $6\times10^{18}$ cm$^{-3}$) and has a thickness of 0.3 μm or more and 1.0 μm or less (i.e., from 0.3 μm to 1.0 μm).

A collector layer 22 includes four layers, e.g., a first collector layer 224, a second collector layer 225, a third collector layer 226, and a fourth collector layer 227 that are stacked in this order from the sub-collector layer 21 toward a base layer 23. The thickness, the material, and the doping concentration of each of the first collector layer 224 to the fourth collector layer 227 will be described later with reference to FIG. 5.

The base layer 23 is made of, for example, p-type Al$_x$Ga$_{1-x}$As having a C concentration of $2\times10^{19}$ cm$^{-3}$ or more and $5\times10^{19}$ cm$^{-3}$ or less (i.e., from $2\times10^{19}$ cm$^{-3}$ to $5\times10^{19}$ cm$^{-3}$) and an AlAs mixed-crystal ratio x of 0.05. The base layer 23 has a thickness of, for example, 50 nm or more and 150 nm or less (i.e., from 50 nm to 150 nm).

An emitter layer 24 is disposed on the entire region of the base layer 23. The emitter layer 24 is made of, for example, n-type In$_x$Ga$_{1-x}$P having a Si concentration of $2\times10^{17}$ cm$^{-3}$ or more and $5\times10^{17}$ cm$^{-3}$ or less (i.e., from $2\times10^{17}$ cm$^{-3}$ to $5\times10^{17}$ cm$^{-3}$) and an InP mixed-crystal ratio x of 0.5.

An emitter cap layer 25 made of, for example, n-type GaAs having a Si concentration of $2\times10^{18}$ cm$^{-3}$ or more and $4\times10^{18}$ cm$^{-3}$ or less (i.e., $2\times10^{18}$ cm$^{-3}$ to $4\times10^{18}$ cm$^{-3}$) is disposed on a partial region of the emitter layer 24. The emitter cap layer 25 has a thickness of, for example, 50 nm or more and 150 nm or less (i.e., from 50 nm to 150 nm).

An emitter contact layer 26 made of, for example, n-type In$_x$Ga$_{1-x}$As having a Si concentration of $1\times10^{19}$ cm$^{-3}$ or more and $3\times10^{19}$ cm$^{-3}$ or less (i.e., from $1\times10^{19}$ cm$^{-3}$ to $3\times10^{19}$ cm$^{-3}$) is disposed on the emitter cap layer 25. The emitter contact layer 26 includes two layers of a lower emitter contact layer 260 and an upper emitter contact layer 261 disposed on the lower emitter contact layer 260. An InAs mixed-crystal ratio x of the lower emitter contact layer 260 linearly changes, for example, from 0 at the interface closer to the base layer 23 to 0.5 at the interface farther from the base layer 23. The InAs mixed-crystal ratio x of the upper emitter contact layer 261 is, for example, 0.5. The lower emitter contact layer 260 and the upper emitter contact layer 261 each have a thickness of, for example, 30 nm or more and 70 nm or less (i.e., from 30 nm to 70 nm).

The thickness and the doping concentration of the emitter layer 24 are set such that the emitter layer 24 in a region where the emitter cap layer 25 is not disposed in plan view is depleted. A collector electrode 31 is disposed on the sub-collector layer 21. The interface between the collector electrode 31 and the sub-collector layer 21 is alloyed, and the collector electrode 31 is thereby in ohmic contact with the sub-collector layer 21. The collector electrode 31 has, for example, a multilayer structure in which a AuGe film having a thickness of 60 nm, a Ni film having a thickness of 10 nm, a Au film having a thickness of 200 nm, a Mo film having a thickness of 10 nm, and a Au film having a thickness of 1 μm are stacked.

A base electrode 32 is disposed on the base layer 23 in an opening provided in the emitter layer 24. The interface between the base electrode 32 and the base layer 23 is alloyed, and the base electrode 32 is thereby in ohmic contact with the base layer 23. The base electrode 32 has, for example, a multilayer structure in which a Ti film having a thickness of 50 nm, a Pt film having a thickness of 50 nm, and a Au film having a thickness of 200 nm are stacked.

An emitter electrode 33 is disposed on the emitter contact layer 26 and is in ohmic contact with the emitter layer 24 with the emitter contact layer 26 and the emitter cap layer 25 therebetween. The emitter electrode 33 has, for example, a multilayer structure in which a Ti film having a thickness of 50 nm, a Pt film having a thickness of 50 nm, and a Au film having a thickness of 200 nm are stacked.

The semiconductor layers including the sub-collector layer 21 to the emitter contact layer 26, the collector electrode 31, the base electrode 32, and the emitter electrode 33 are covered with a protective film 35. The protective film 35 is made of, for example, SiN. Metal wiring lines are formed on the protective film 35.

Figure 5:
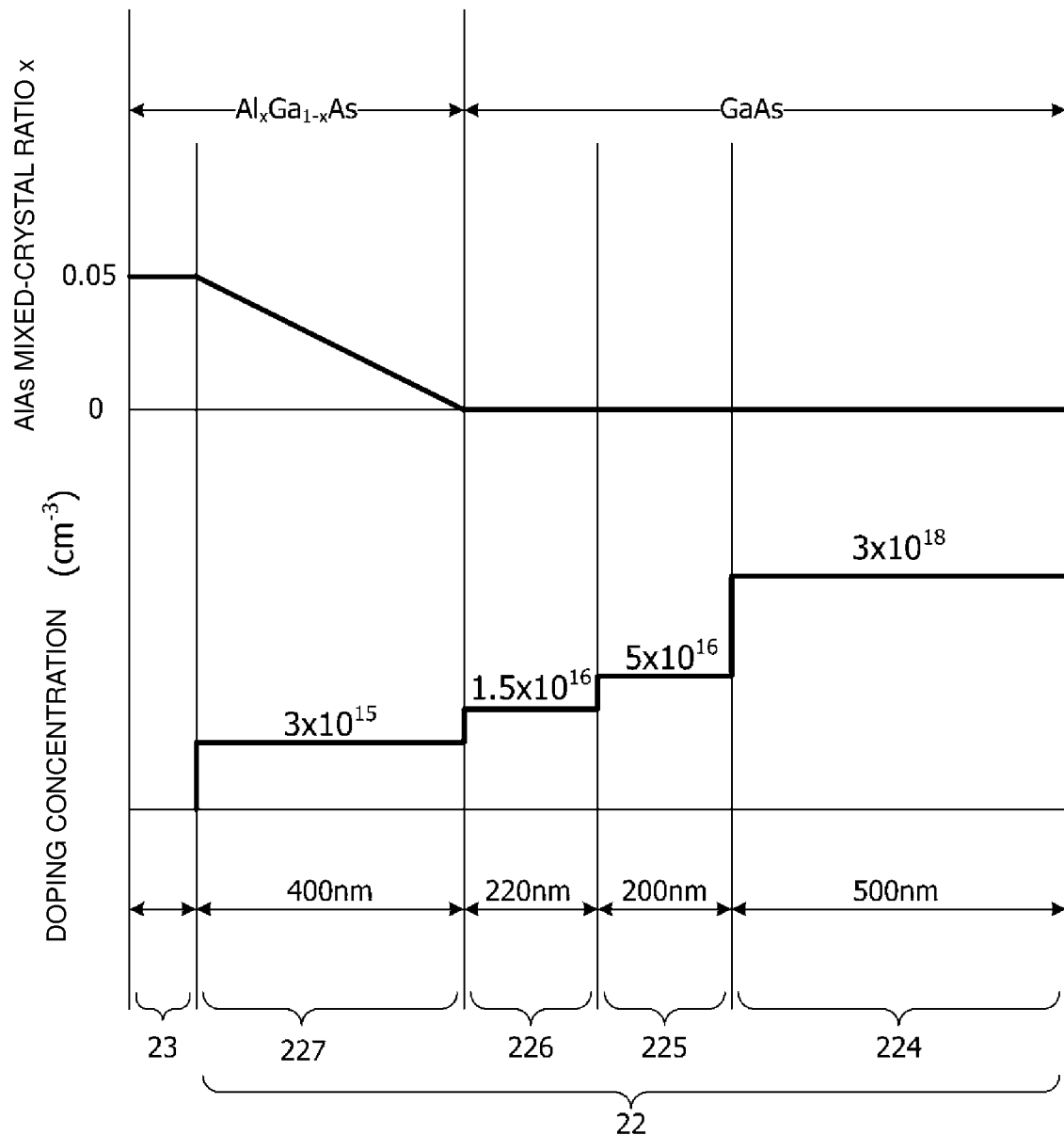
FIG. 5 is a graph showing a distribution of an AlAs mixed-crystal ratio x and a distribution of a doping concentration with respect to a thickness direction of a collector layer of an HBT according to the second embodiment.

FIG. 5 is a graph showing a distribution of an AlAs mixed-crystal ratio x and a distribution of a doping concentration with respect to a thickness direction of the collector layer 22. The first collector layer 224, the second collector layer 225, the third collector layer 226, and the fourth collector layer 227 have thicknesses of, for example, 500 nm, 200 nm, 220 nm, and 400 nm, respectively.

The first collector layer 224 to the third collector layer 226 are each made of n-type GaAs. The fourth collector layer 227 is made of n-type $Al_xGa_{1-x}As$. The fourth collector layer 227 is a graded semiconductor layer in which the AlAs mixed-crystal ratio x linearly changes from 0.05 at the interface closer to the base layer 23 to 0 at the interface closer to the sub-collector layer 21.

The base layer 23 is made of p-type $Al_xGa_{1-x}As$. The AlAs mixed-crystal ratio x of the base layer 23 is equal to the AlAs mixed-crystal ratio x of the fourth collector layer 227 at the interface on the base side. Therefore, at the base-collector interface, the electron affinity of the base layer 23 is equal to the electron affinity of the collector layer 22 at the interface on the base side.

The first collector layer 224, the second collector layer 225, the third collector layer 226, and the fourth collector layer 227 have Si concentrations of, for example, $3 \times 10^{18}$ $cm^{-3}$, $5 \times 10^{16}$ $cm^{-3}$, $1.5 \times 10^{16}$ $cm^{-3}$, and $3 \times 10^{15}$ $cm^{-3}$, respectively. Thus, the collector layer 22 includes a first portion formed of the fourth collector layer 227, which has the lowest concentration, and a second portion formed of the first collector layer 224, the second collector layer 225, and the third collector layer 226, all of which have higher concentration than the first collector layer 224. Furthermore, the second portion includes a third portion formed of the second collector layer 225 and the third collector layer 226, which have relatively low concentrations, and a fourth portion formed of the first collector layer 224, which has the higher concentration.

Figure 6:
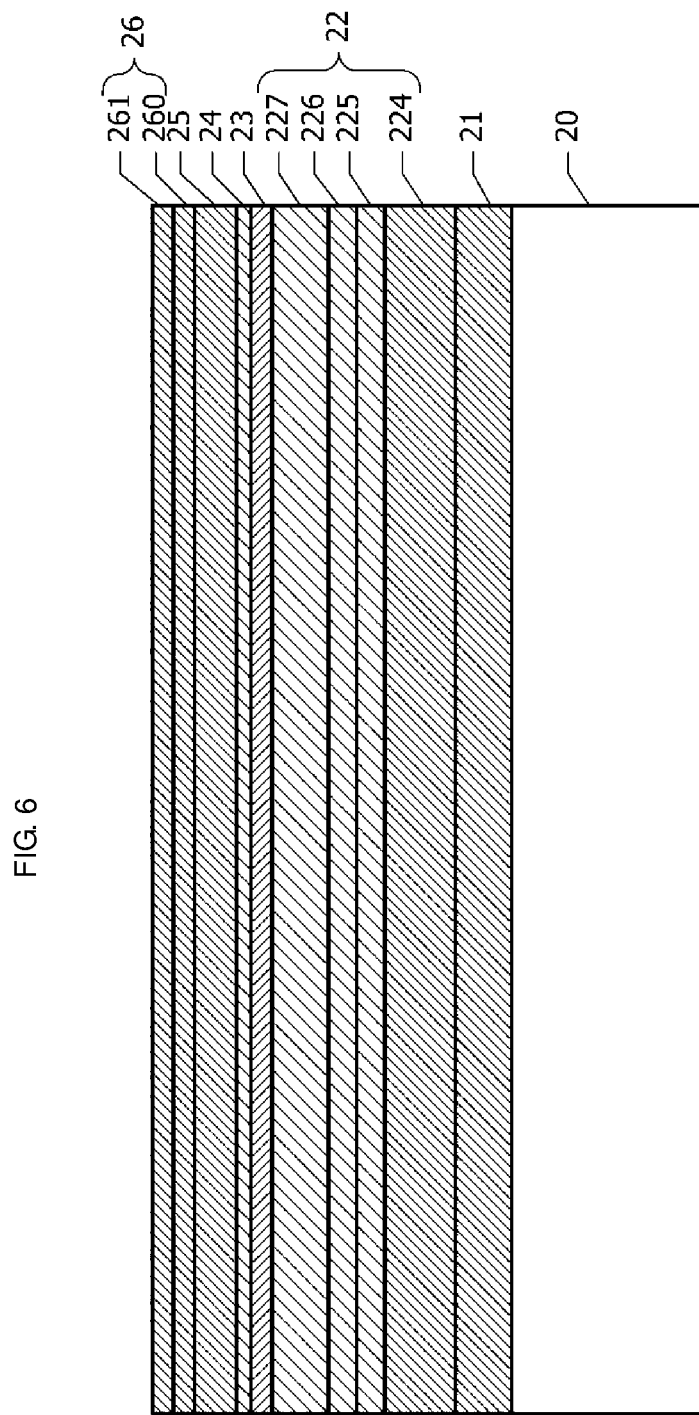
FIG. 6 is a sectional view of an HBT according to the second embodiment during its production.
Figure 7:
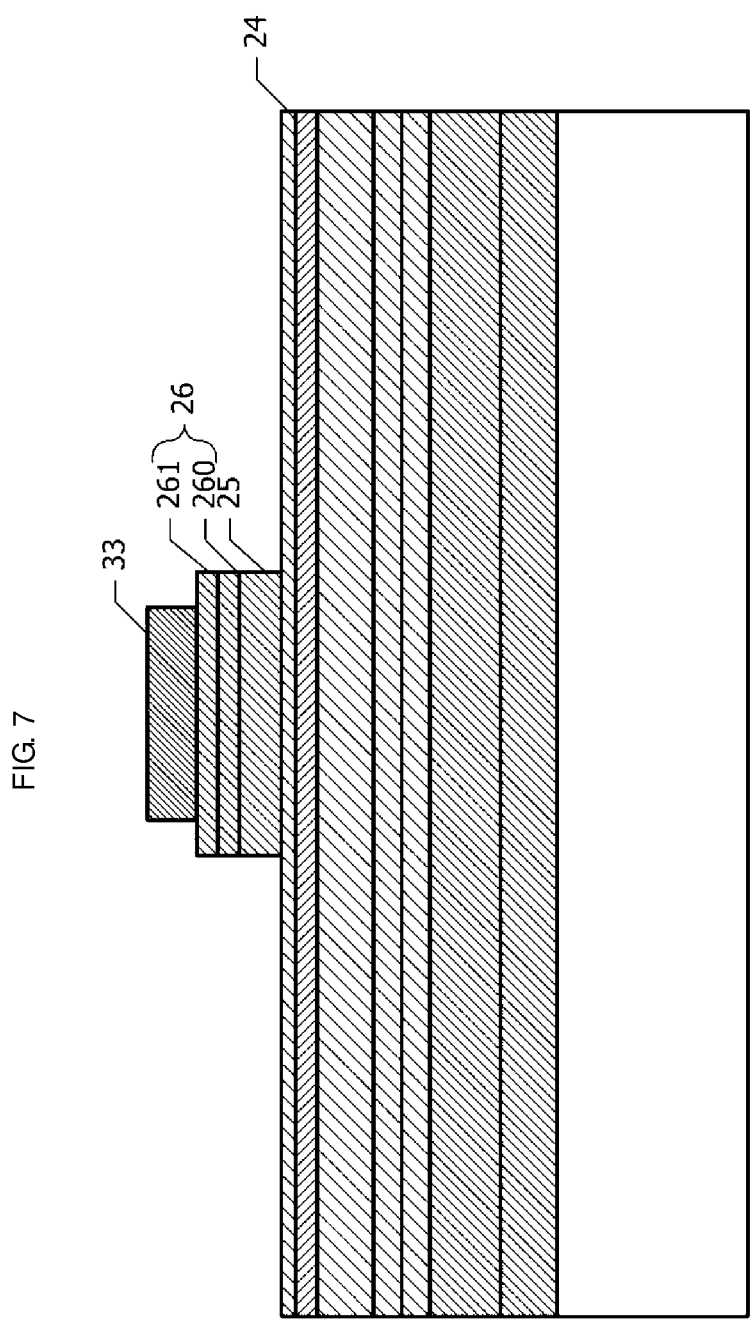
FIG. 7 is a sectional view of an HBT according to the second embodiment during its production.
Figure 8:
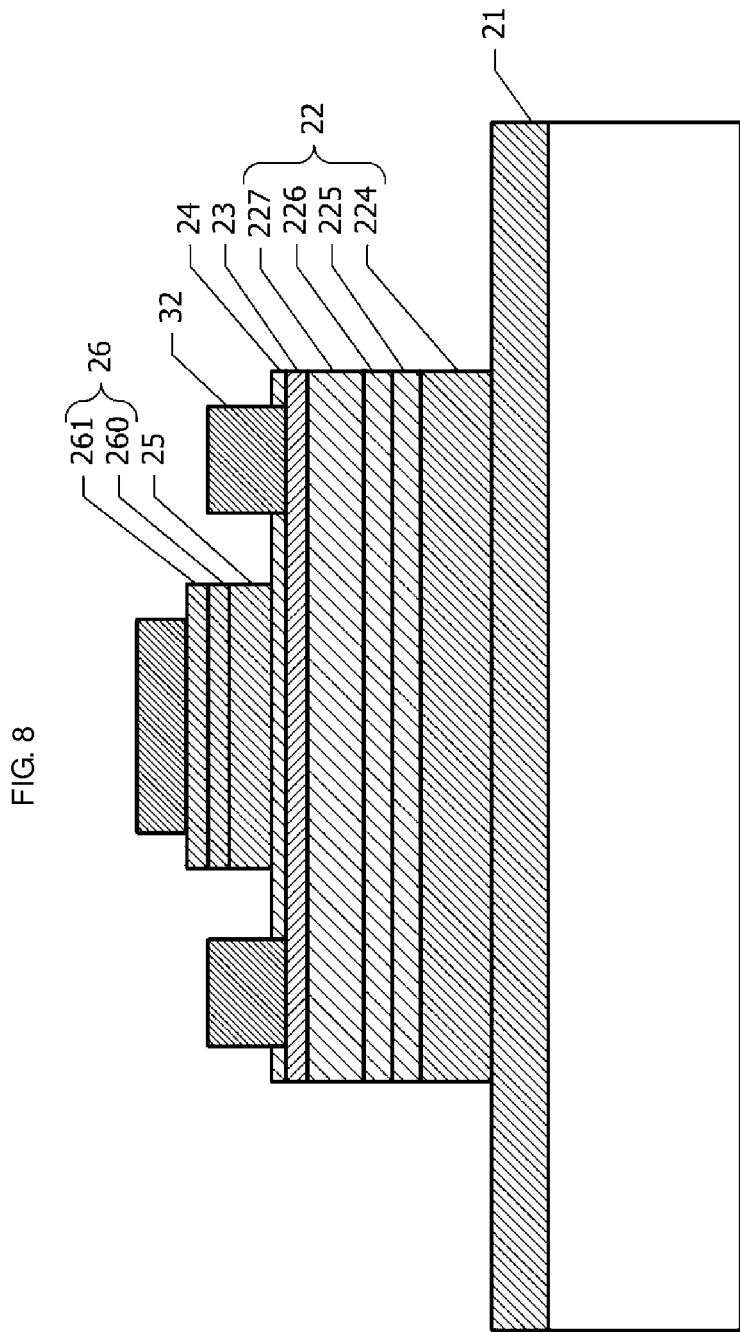
FIG. 8 is a sectional view of an HBT according to the second embodiment during its production.

Next, a method for producing an HBT according to the second embodiment will be described with reference to FIGS. 6 to 8. FIGS. 6, 7, and 8 are sectional views of an HBT during its production.

As illustrated in FIG. 6, semiconductor layers including a sub-collector layer 21 to an emitter contact layer 26 are epitaxially grown on a substrate 20 made of semi-insulating GaAs. This growth can be conducted by, for example, metalorganic chemical vapor deposition (MOCVD) or the like.

As illustrated in FIG. 7, an emitter electrode 33 is formed on a partial region of the emitter contact layer 26. The emitter electrode 33 can be formed by, for example, vacuum evaporation and a lift-off method.

After the formation of the emitter electrode 33, unnecessary portions of the emitter contact layer 26 and the emitter cap layer 25 are removed by etching using a photoresist film (not shown) having a predetermined pattern as an etching mask. In this etching, it is preferable to use an etchant capable of selectively etching the emitter contact layer 26 made of InGaAs and the emitter cap layer 25 made of GaAs relative to the emitter layer 24 made of InGaP. After the etching, the photoresist film used as the etching mask is removed. As a result of the above-described steps, a mesa structure including the emitter cap layer 25 and the emitter contact layer 26 is formed.

As illustrated in FIG. 8, unnecessary portions of the emitter layer 24, the base layer 23, and the collector layer 22 are removed by etching using a photoresist film (not shown) having a predetermined pattern as an etching mask. As a result, a mesa structure including the collector layer 22, the base layer 23, and the emitter layer 24 is formed. The sub-collector layer 21 is exposed around the mesa structure. The stop of this etching is performed by controlling the time. After the etching, the photoresist film used as the etching mask is removed.

The emitter layer 24 is etched by using, as an etching mask, a photoresist film (not shown) having an opening in a region where a base electrode 32 is to be formed to form an opening. The base layer 23 is exposed in the opening. The base electrode 32 is formed on the base layer 23 in the opening. Base electrode materials are deposited also on the photoresist film. The base electrode 32 can be formed by vacuum evaporation. The photoresist film is removed (lifted off) together with the base electrode materials deposited thereon. Subsequently, an alloying treatment is performed, so that the base electrode 32 is brought into ohmic contact with the base layer 23.

As illustrated in FIG. 4, a collector electrode 31 is formed on the sub-collector layer 21. The collector electrode 31 can be formed by vacuum evaporation and a lift-off method. Subsequently, an alloying treatment is performed, so that the collector electrode 31 is brought into ohmic contact with the sub-collector layer 21. After the alloying treatment, a protective film 35 made of SiN is formed.

Next, advantageous effects of the HBT according to the second embodiment will be described.

In the second embodiment, the collector layer 22 includes no inversely graded semiconductor layer, and the electron affinity of the fourth collector layer 227, which is a graded semiconductor layer, at the interface on the base side is equal to the electron affinity of the base layer 23, as in the first embodiment. Therefore, an energy barrier to electrons is not formed in the collector layer 22. As a result, the blocking effect does not occur, and thus the ft-Ic characteristics are flat. Furthermore, since a high-concentration layer such as a delta-doped layer is not disposed in the collector layer 22 near the base layer 23, the linearity of the voltage dependence of the base-collector capacitance Cbc can be ensured.

Due to the two factors described above, the ACLR in high-output operation and radio-frequency characteristics can be improved in a high-frequency power amplifier including the HBT according to the second embodiment. In the case where the ACLR is fixed, the efficiency of the power amplifier can be enhanced.

Next, the effect of the distribution of the doping concentration of the collector layer 22 shown in FIG. 5 will be described. In the second embodiment, the doping concentration of the fourth collector layer 227 is $3 \times 10^{15}$ $cm^{-3}$, which is sufficiently lower than an ordinary doping concentration. Furthermore, the doping concentration of the fourth collector layer 227 is about four orders of magnitude lower than the doping concentration of the base layer 23. Therefore, when a collector voltage Vce is increased, a depletion layer between the base and the collector rapidly extends toward the inside of the collector layer 22. At the time when the collector voltage Vce reaches a collector saturation voltage in a saturation operation region of the HBT, the depletion layer substantially reaches the interface between the third collector layer 226 and the fourth collector layer 227.

Furthermore, in the second embodiment, the doping concentration of the third collector layer 226 is five times the doping concentration of the fourth collector layer 227. When the depletion layer reaches the interface between the third collector layer 226 and the fourth collector layer 227, further extension of the depletion layer is suppressed because the doping concentration of the third collector layer 226 is sufficiently higher than the doping concentration of the fourth collector layer 227. Therefore, even when the collector voltage Vce is increased in a region in which the collector voltage Vce is higher than the collector saturation voltage (active operation region), extension of the depletion layer is suppressed. As a result, the linearity of the voltage dependence of the base-collector capacitance Cbc is improved.

In order to obtain a sufficient effect of improving the linearity of the voltage dependence of the base-collector capacitance Cbc, the doping concentration of the fourth collector layer 227 is preferably $3 \times 10^{15}$ cm$^{-3}$ or less. The fourth collector layer 227 may be made of p-type AlGaAs having a doping concentration of $1 \times 10^{15}$ cm$^{-3}$ or less, or undoped AlGaAs. In general, the fourth collector layer 227 is preferably made of at least one semiconductor selected from the group consisting of n-type semiconductors having a doping concentration of $3 \times 10^{15}$ cm$^{-3}$ or less, p-type semiconductors having a doping concentration of $1 \times 10^{15}$ cm$^{-3}$ or less, and intrinsic semiconductors. Furthermore, the doping concentrations of the third collector layer 226 and the second collector layer 225 are each preferably $1 \times 10^{16}$ cm$^{-3}$ or more and $7 \times 10^{16}$ cm$^{-3}$ or less (i.e., from $1 \times 10^{16}$ cm$^{-3}$ to $7 \times 10^{16}$ cm$^{-3}$). The doping concentration of the second collector layer 225 is preferably equal to or higher than the doping concentration of the third collector layer 226 within this doping concentration range.

Furthermore, in the second embodiment, the fourth collector layer 227, which has the lowest concentration, is formed of a graded semiconductor layer. In the case of such a configuration in which the fourth collector layer 227 which is a graded semiconductor layer is included in a low-concentration region, a more significant effect of improving the linearity of the voltage dependence of the base-collector capacitance Cbc is obtained.

When a low-concentration region is present on the side closer to the base layer 23, the electric field in the low-concentration region is weakened by the Kirk effect, and thus there is a concern about a decrease in the electron velocity. The decrease in the electron velocity may cause a decrease in the cutoff frequency ft. In the second embodiment, since the fourth collector layer 227 having a low concentration is formed of a graded semiconductor layer, an effective electric field is generated in the fourth collector layer 227. Electrons are drifted by this effective electric field, and thus the decrease in the cutoff frequency ft due to the Kirk effect can be compensated. Thus, when the fourth collector layer 227 having a low concentration is formed of a graded semiconductor layer, the effects of improving radio-frequency characteristics of a power amplifier and improving the ACLR are enhanced.

In the second embodiment, the doping concentrations of the second collector layer 225, the third collector layer 226, and the fourth collector layer 227 are 1/10 or less of the doping concentration of the first collector layer 224 and the doping concentration of the sub-collector layer 21. This configuration can enhance the base-collector breakdown voltage and the emitter-collector breakdown voltage. To increase the breakdown voltage, the second collector layer 225 preferably has a thickness of 100 nm or more and 300 nm or less (i.e., from 100 nm to 300 nm) and a doping concentration of $3 \times 10^{16}$ cm$^{-3}$ or more and $7 \times 10^{16}$ cm$^{-3}$ or less (i.e., from $3 \times 10^{16}$ cm$^{-3}$ to $7 \times 10^{16}$ cm$^{-3}$). Furthermore, the third collector layer 226 preferably has a thickness of 100 nm or more and 300 nm or less (i.e., from 100 nm to 300 nm) and a doping concentration of $1 \times 10^{16}$ cm$^{-3}$ or more and $4 \times 10^{16}$ cm$^{-3}$ or less (i.e., from $1 \times 10^{16}$ cm$^{-3}$ to $4 \times 10^{16}$ cm$^{-3}$). Furthermore, the fourth collector layer 227 preferably has a thickness of 300 nm or more and 500 nm or less (i.e., from 300 nm to 500 nm) and a doping concentration of $3 \times 10^{15}$ cm$^{-3}$ or less.

The first collector layer 224 forms, together with the sub-collector layer 21, a parallel resistance that causes the collector current Ic to flow in the in-plane direction. In order to reduce the collector resistance of the HBT, the doping concentration of the first collector layer 224 is preferably substantially the same as the doping concentration of the sub-collector layer 21, for example, 0.5 times or more and 1.5 times or less (i.e., from 0.5 time to 1.5 times) the doping concentration of the sub-collector layer 21. For example, the doping concentration of the first collector layer 224 is preferably in a range of $1 \times 10^{18}$ cm$^{-3}$ or more and $5 \times 10^{18}$ cm$^{-3}$ or less (i.e., from $1 \times 10^{18}$ cm$^{-3}$ to $5 \times 10^{18}$ cm$^{-3}$). Preferably, the thickness of the first collector layer 224 is substantially the same as the thickness of the sub-collector layer 21. The reduction in the collector resistance enables higher output and an improvement in the efficiency of a power amplifier to be realized.

Modification of Second Embodiment

Next, modifications of the second embodiment will be described.

In the second embodiment, the AlAs mixed-crystal ratio x of the base layer 23 (FIG. 4) made of p-type Al$_x$Ga$_{1-x}$As is uniform with respect to the thickness direction. Alternatively, the AlAs mixed-crystal ratio x of the base layer 23 may be changed in the thickness direction. In such a case, the electron affinity is preferably gradually increased from the emitter layer 24 toward the collector layer 22. Preferably, for example, the AlAs mixed-crystal ratio x of the base layer 23 is linearly changed from 0.07 on the emitter layer 24 side to 0.05 on the collector layer 22 side. When the electron affinity has such a distribution, electrons can be drifted in the base layer 23. Consequently, the cutoff frequency ft can be improved.

In the second embodiment, the interface between a graded semiconductor layer made of AlGaAs and a uniform composition layer made of GaAs coincides with the interface at which the doping concentration discontinuously changes (the interface between the third collector layer 226 and the fourth collector layer 227). However, these two interfaces need not coincide with each other.

Figure 9:
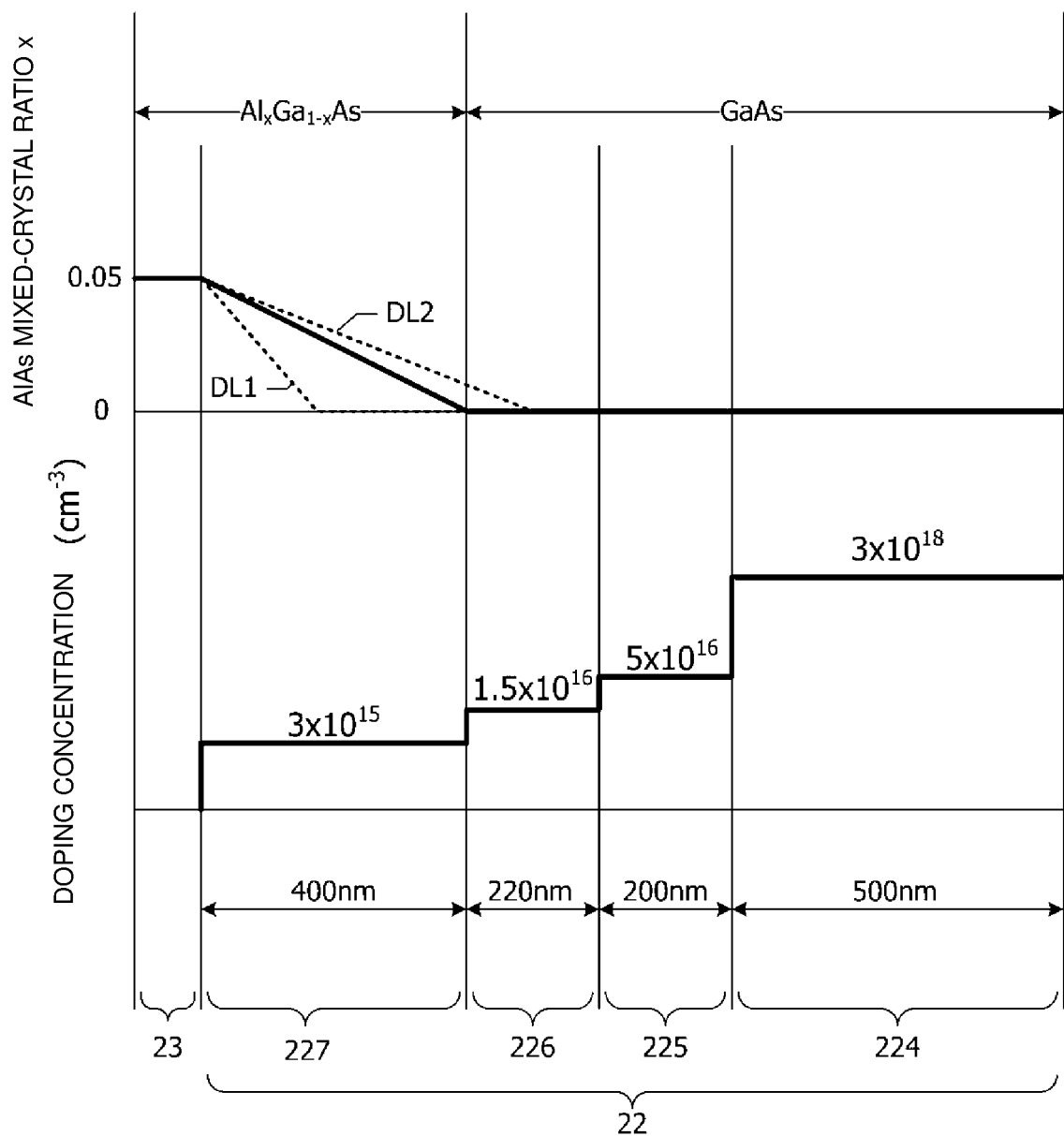
FIG. 9 is a graph showing a distribution of an AlAs mixed-crystal ratio x and a distribution of a doping concentration in a collector layer of an HBT according to a modification of the second embodiment.

FIG. 9 is a graph showing a distribution of an AlAs mixed-crystal ratio x and a distribution of a doping concentration in a collector layer 22 of an HBT according to a modification of the second embodiment. As shown by dashed line DL1 in FIG. 9, the interface between the graded semiconductor layer (AlGaAs layer) and the GaAs layer (the position at which the AlAs mixed-crystal ratio x becomes 0) may be disposed in a low-concentration region (the fourth collector layer 227) which is depleted during active operation of the HBT. In this case, the region which is depleted during active operation of the HBT extends through the interface between the graded semiconductor layer and the GaAs layer to the GaAs layer. On the other hand, as shown by dashed line DL2 in FIG. 9, the interface between the graded semiconductor layer and the GaAs layer may be disposed in the third collector layer 226. In this case, the region which is depleted during active operation of the HBT remains in the graded semiconductor layer, and a non-depleted region is partly left in the graded semiconductor layer.

As in the modifications shown by dashed lines DL1 and DL2 in FIG. 9, the drift velocity of electrons can be maximized by independently selecting the thickness of the graded semiconductor layer without limitation of the thickness of the fourth collector layer 227. In addition, the drift velocity of electrons can be maximized by optimizing not only the thickness of the graded semiconductor layer but also the AlAs mixed-crystal ratio x.

In each of the configurations shown by dashed lines DL1 and DL2 in FIG. 9, an energy barrier to electrons is not formed at the interface between the graded semiconductor layer and the GaAs layer.

In the second embodiment, Si is used as a dopant of the emitter contact layer 26. In order to achieve a higher concentration, at least one of Se and Te may be used as the n-type dopant. In the second embodiment, although the emitter layer 24, the base layer 23, and a portion of the collector layer 22 on the base layer 23 side are made of InGaP, AlGaAs, and AlGaAs, respectively, they may be made of other compound semiconductors. Examples of combinations of compound semiconductors of the emitter layer 24, the base layer 23, and a portion of the collector layer 22 on the base layer 23 side include a combination of InGaP, GaAs, and GaInAsN, a combination of AlGaAs, AlGaAs, and AlGaAs having different mixed-crystal ratios, a combination of AlGaAs, GaAs, and GaInAsN, a combination of InGaP, InGaAs, and GaInAsN, a combination of InGaP, GaAsSb, and AlGaAs, a combination of InGaP, GaAsSb, and GaInAsN, a combination of InGaP, AlGaAs, and GaInAsN, and a combination of InGaP, GaInAsN, and GaInAsN.

The first collector layer 224 of the HBT according to the second embodiment may be omitted, and the collector layer 22 may be constituted by three layers of the second collector layer 225, the third collector layer 226, and the fourth collector layer 227. This configuration also provides the effect of improving the linearity of the voltage dependence of the base-collector capacitance Cbc and the effect of suppressing a decrease in the cutoff frequency ft.

Third Embodiment

Next, an HBT according to a third embodiment will be described with reference to FIG. 10. Hereinafter, descriptions of configurations that are common to those of the HBT (FIG. 4, etc.) according to the second embodiment will be omitted.

Figure 10:
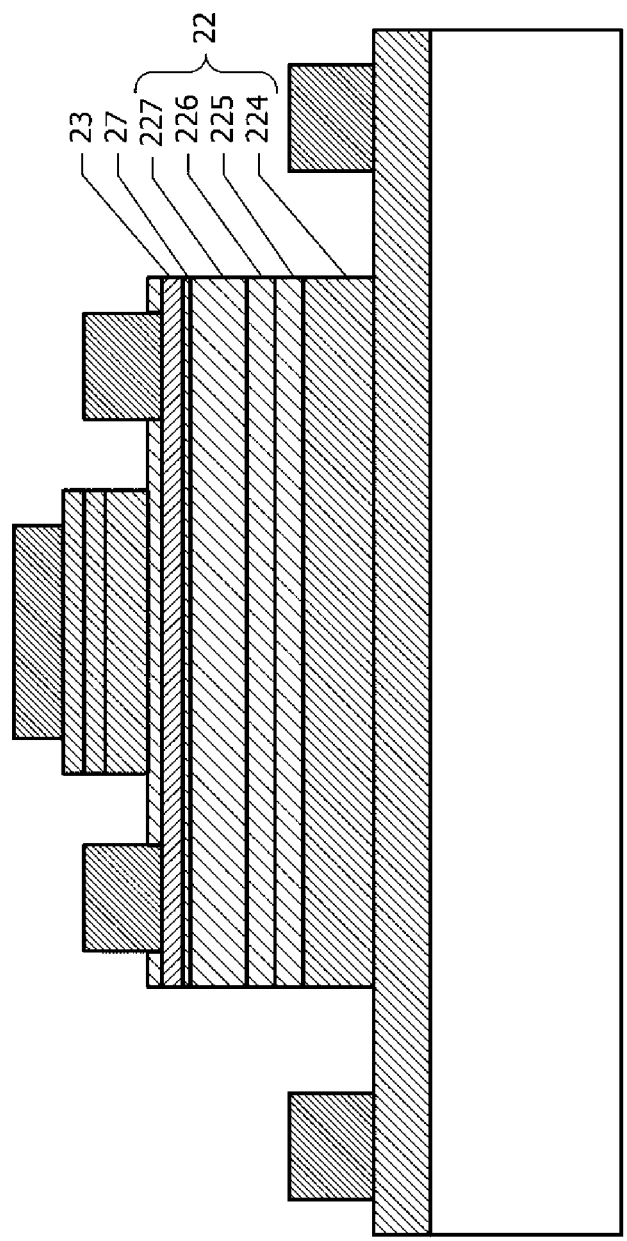
FIG. 10 is a sectional view of an HBT according to a third embodiment.

FIG. 10 is a sectional view of an HBT according to the third embodiment. In the third embodiment, an intermediate layer 27 made of a compound semiconductor that does not contain Al as a group III element is disposed between a collector layer 22 and a base layer 23. The intermediate layer 27 is made of, for example, n-type GaAs having a Si concentration of $3\times10^{15}$ cm$^{-3}$. The intermediate layer 27 has a thickness of, for example, 3 nm or more and 10 nm or less (i.e., from 3 nm to 10 nm).

In the third embodiment, after the collector layer 22 is epitaxially grown, the growth temperature is decreased while the intermediate layer 27 is grown. The base layer 23 is grown at a temperature lower than the growth temperature of the collector layer 22. The decrease in the growth temperature of the base layer 23 enables the base layer 23 to be doped with a dopant at a high concentration. The increase in the doping concentration of the base layer 23 enables the base resistance to be decreased. The decrease in the base resistance enables the gain of a power amplifier to be improved.

Next, advantageous effects of the HBT according to the third embodiment will be described.

Aluminum (Al) contained in the fourth collector layer 227 has a property of being easily oxidized. In the third embodiment, after the growth of the fourth collector layer 227, the Al-free intermediate layer 27 is continuously grown. Accordingly, a state in which the surface of the fourth collector layer 227 is exposed is not maintained during the decrease of the substrate temperature. Thus, oxidation of Al can be suppressed. As a result, degradation of the crystal quality at the interface between the collector layer 22 and the base layer 23 can be suppressed.

Fourth Embodiment

Next, an HBT according to a fourth embodiment will be described with reference to FIGS. 11 and 12. Hereinafter, descriptions of configurations that are common to those of the HBT (FIG. 4, etc.) according to the second embodiment will be omitted. In the fourth embodiment, the configurations of a collector layer 22 and a base layer 23 are different from those of the collector layer 22 and the base layer 23 in the second embodiment.

Figure 11:
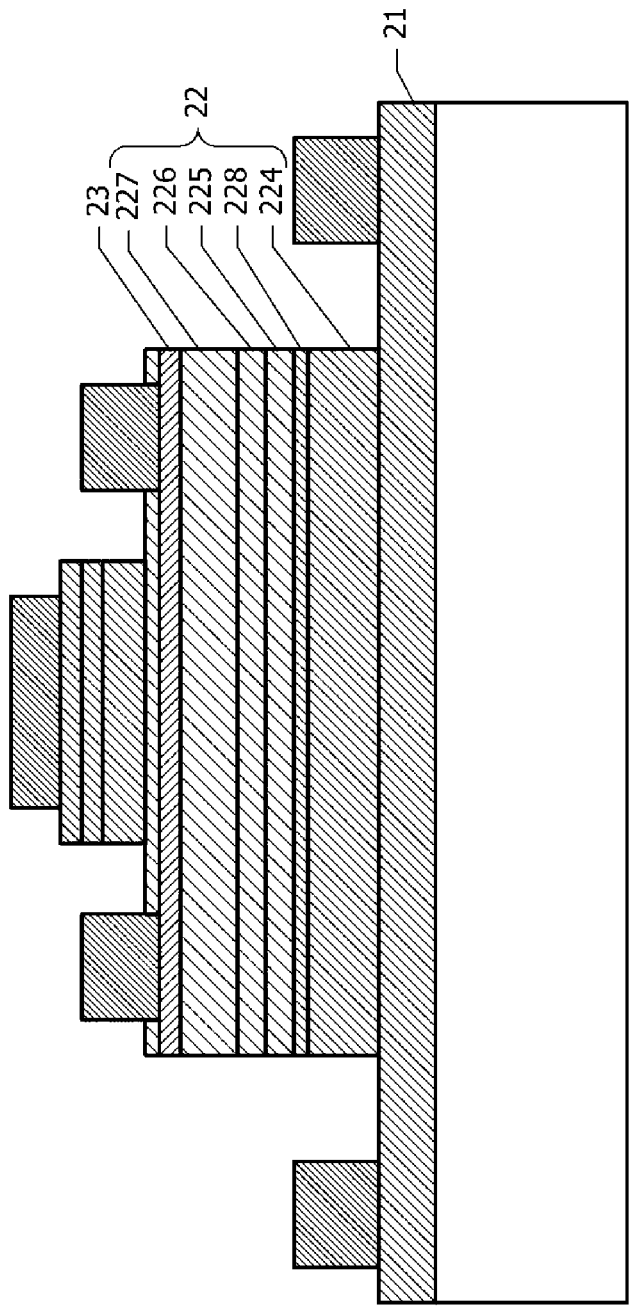
FIG. 11 is a sectional view of an HBT according to a fourth embodiment.

FIG. 11 is a sectional view of an HBT according to the fourth embodiment. In the fourth embodiment, the base layer 23 is made of p-type GaAs having a C concentration of $2\times10^{19}$ cm$^{-3}$ or more and $5\times10^{19}$ cm$^{-3}$ or less (i.e., from $2\times10^{19}$ cm$^{-3}$ to $5\times10^{19}$ cm$^{-3}$). The base layer 23 has a thickness of 50 nm or more and 150 nm or less (i.e., from 50 nm to 150 nm). In the fourth embodiment, the collector layer 22 has a five-layer structure in which a first collector layer 224, a fifth collector layer 228, a second collector layer 225, a third collector layer 226, and a fourth collector layer 227 are stacked upward from a sub-collector layer 21.

Figure 12:
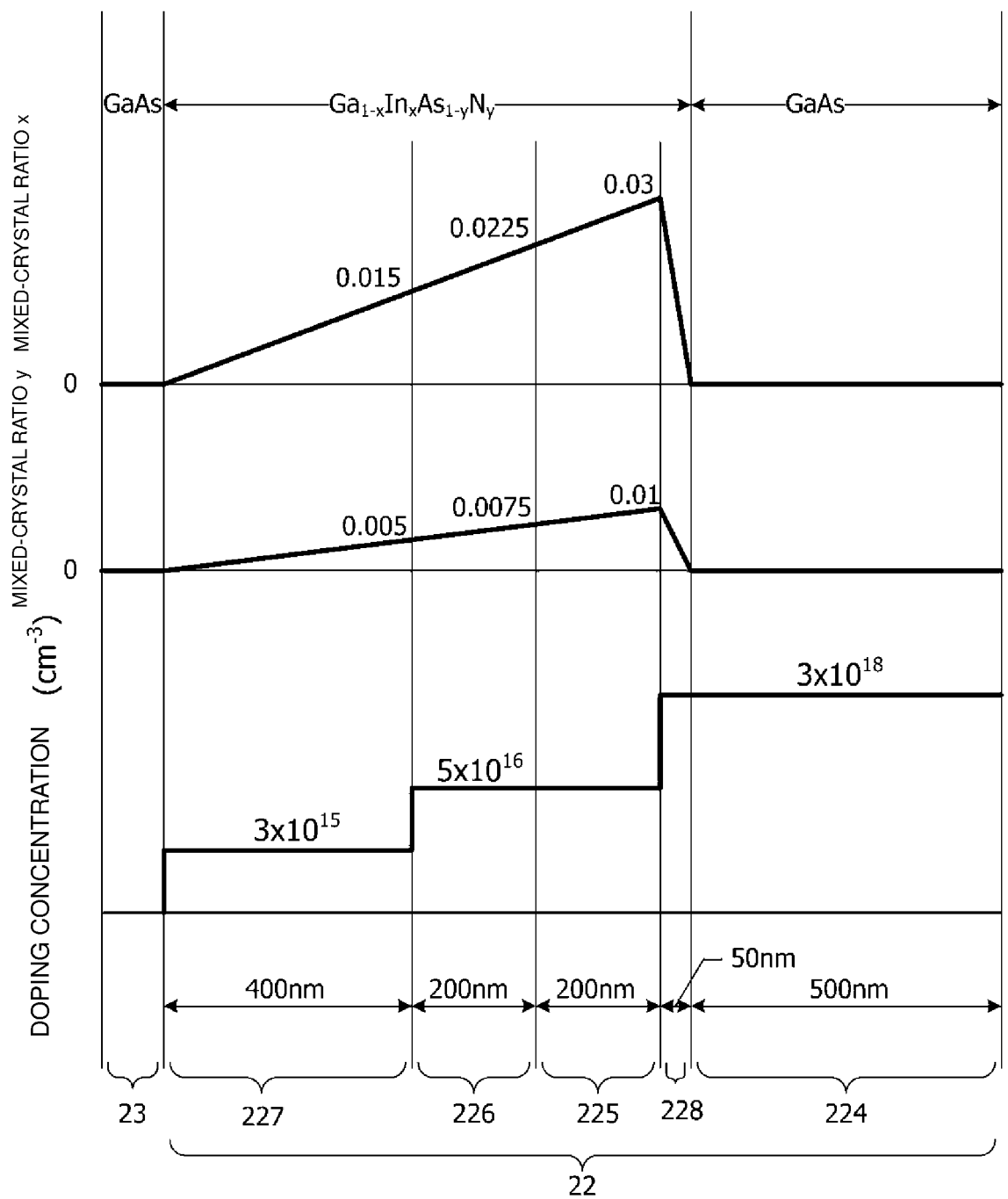
FIG. 12 is a graph showing a composition distribution and a doping concentration distribution of a collector layer of an HBT according to the fourth embodiment.

FIG. 12 is a graph showing a composition distribution and a doping concentration distribution of the collector layer 22. The first collector layer 224, the fifth collector layer 228, the second collector layer 225, the third collector layer 226, and the fourth collector layer 227 have thicknesses of, for example, 500 nm, 50 nm, 200 nm, 200 nm, and 400 nm, respectively. Each of the fifth collector layer 228 to the fourth collector layer 227 is formed of $Ga_{1-x}In_xAs_{1-y}N_y$, and the first collector layer 224 is made of GaAs.

A mixed-crystal ratio x of the fourth collector layer 227 linearly changes from 0 at the interface closer to the base layer 23 to 0.015 at the interface closer to the sub-collector layer 21, and similarly, a mixed-crystal ratio y of the fourth collector layer 227 linearly changes from 0 to 0.005. The mixed-crystal ratio x of the third collector layer 226 linearly changes from 0.015 at the interface closer to the base layer 23 to 0.0225 at the interface closer to the sub-collector layer 21, and similarly, the mixed-crystal ratio y of the third collector layer 226 linearly changes from 0.005 to 0.0075. The mixed-crystal ratio x of the second collector layer 225 linearly changes from 0.0225 at the interface closer to the base layer 23 to 0.03 at the interface closer to the sub-collector layer 21, and similarly, the mixed-crystal ratio y of the second collector layer 225 linearly changes from 0.0075 to 0.01. The mixed-crystal ratio x of the fifth collector layer 228 linearly changes from 0.03 at the interface closer to the base layer 23 to 0 at the interface closer to the sub-collector layer 21, and similarly, the mixed-crystal ratio y of the fifth collector layer 228 linearly changes from 0.01 to 0. The mixed-crystal ratio x and the mixed-crystal ratio y linearly change from the fourth collector layer 227 to the second collector layer 225 in this manner. These semiconductor layers are lattice-matched to a substrate 20 made of GaAs.

The fourth collector layer 227 has a doping concentration of $3\times10^{15}$ cm$^{-3}$. The third collector layer 226 and the second collector layer 225 each have a doping concentration of $5\times10^{16}$ cm$^{-3}$. The fifth collector layer 228 and the first collector layer 224 each have a doping concentration of $3\times10^{18}$ cm$^{-3}$.

In the fourth embodiment, the second collector layer 225, the third collector layer 226, and the fourth collector layer 227 are graded semiconductor layers. The fifth collector layer 228 is an inversely graded semiconductor layer.

Advantageous effects that are the same as or similar to those of the second embodiment are achieved also in the fourth embodiment. In the fourth embodiment, an energy barrier to electrons is formed at the interface between the fifth collector layer 228 and the first collector layer 224. However, since both the fifth collector layer 228 and the first collector layer 224 are doped at a high concentration, the blocking effect against electron transport can be significantly reduced. Consequently, a decrease in the cutoff frequency ft in high-output operation can be suppressed.

Fifth Embodiment

Next, an HBT according to a fifth embodiment will be described with reference to FIGS. 13 and 14. Hereinafter, descriptions of configurations that are common to those of the HBT (FIG. 4, etc.) according to the second embodiment will be omitted. In the second embodiment, a GaAs substrate is used as the substrate 20. In the fifth embodiment, a semi-insulating InP substrate is used as a substrate 20. Semiconductor layers grown on the substrate 20 are lattice-matched to InP.

Figure 13:
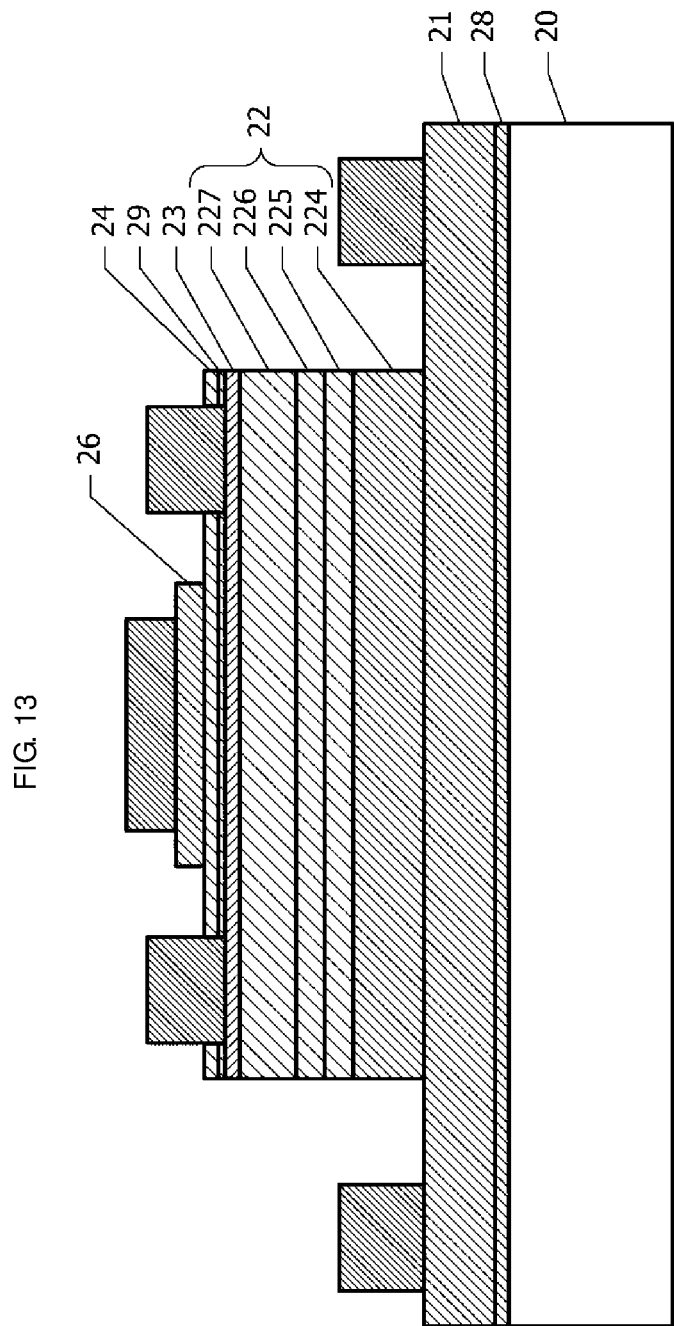
FIG. 13 is a sectional view of an HBT according to a fifth embodiment.

FIG. 13 is a sectional view of an HBT according to the fifth embodiment. A buffer layer 28 made of undoped InP and having a thickness of 10 nm is disposed between the substrate 20 and a sub-collector layer 21. The sub-collector layer 21 is made of n-type $In_{0.53}Ga_{0.47}As$ having a Si concentration of $5 \times 10^{18}$ $cm^{-3}$. The sub-collector layer 21 has a thickness of, for example, 500 nm.

The collector layer 22 includes four layers of a first collector layer 224 to a fourth collector layer 227 as in the second embodiment. The composition, the doping concentration, and the thickness of each of the layers that form the collector layer 22 will be described later with reference to FIG. 14.

A base layer 23 is made of, for example, p-type $In_{0.87}Ga_{0.13}As_{0.29}P_{0.71}$ having a concentration of a p-type dopant of $2 \times 10^{19}$ $cm^{-3}$. As the p-type dopant, C, Zn, or Be is used. The base layer 23 has a thickness of, for example, 50 nm.

A spacer layer 29 made of undoped $In_{0.87}Ga_{0.13}As_{0.29}P_{0.71}$ is disposed between the base layer 23 and an emitter layer 24. The spacer layer 29 has a thickness of, for example, 5 nm.

The emitter layer 24 is made of, for example, n-type InP having a Si concentration of $3 \times 10^{17}$ $cm^{-3}$. The emitter layer 24 has a thickness of, for example, 50 nm.

An emitter contact layer 26 is disposed on the emitter layer 24. In the fifth embodiment, the emitter cap layer 25 (FIG. 4) is not provided. The emitter contact layer 26 is made of, for example, n-type $In_{0.53}Ga_{0.47}As$ having a Si concentration of $2 \times 10^{19}$ $cm^{-3}$. The emitter contact layer 26 has a thickness of, for example, 100 nm.

Figure 14:
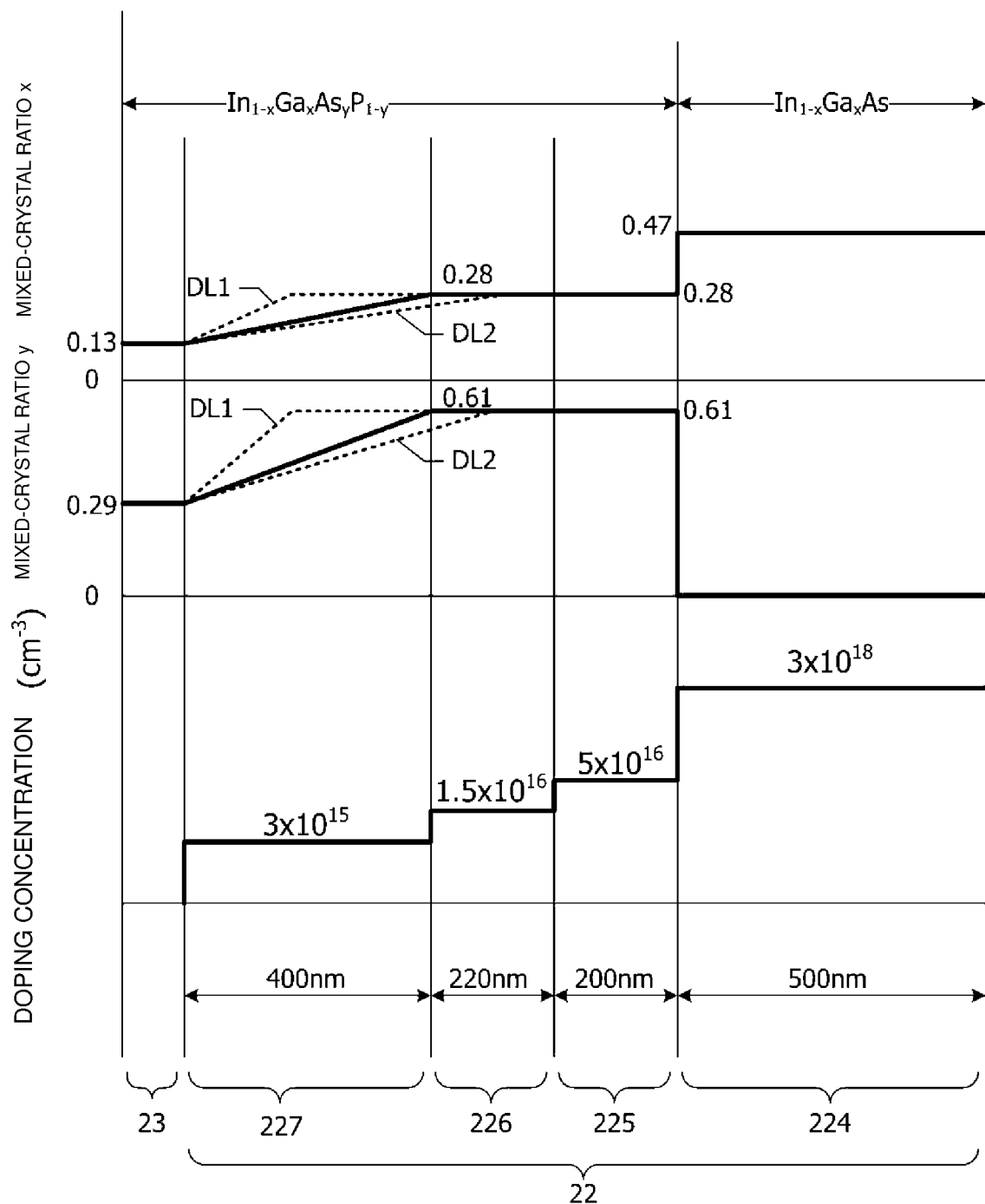
FIG. 14 is a graph showing a composition distribution and a doping concentration distribution of a collector layer of an HBT according to the fifth embodiment.

FIG. 14 is a graph showing a composition distribution and a doping concentration distribution of the collector layer 22. The first collector layer 224, the second collector layer 225, the third collector layer 226, and the fourth collector layer 227 have thicknesses of, for example, 500 nm, 200 nm, 220 nm, and 400 nm, respectively.

The first collector layer 224 is made of n-type $In_{1-x}Ga_xAs$ and has a GaAs mixed-crystal ratio x of 0.47. The second collector layer 225, the third collector layer 226, and the fourth collector layer 227 are each made of n-type $In_{1-x}Ga_xAs_yP_{1-y}$. The second collector layer 225 and the third collector layer 226 each have a mixed-crystal ratio x of 0.28 and a mixed-crystal ratio y of 0.61. The mixed-crystal ratio x of the fourth collector layer 227 linearly changes from 0.13 at the interface closer to the base layer 23 to 0.28 at the interface closer to the sub-collector layer 21, and similarly, the mixed-crystal ratio y of the fourth collector layer 227 linearly changes from 0.29 to 0.61. The fourth collector layer 227 is a graded semiconductor layer.

The first collector layer 224 has a Si concentration of $3 \times 10^{18}$ $cm^{-3}$. The second collector layer 225 has a Si concentration of $5 \times 10^{16}$ $cm^{-3}$. The third collector layer 226 has a Si concentration of $1.5 \times 10^{16}$ $cm^{-3}$. The fourth collector layer 227 has a Si concentration of $3 \times 10^{15}$ $cm^{-3}$.

Advantageous effects that are the same as or similar to those of the HBT according to the second embodiment are achieved also in the fifth embodiment because the distribution of the electron affinity and the distribution of the doping concentration in the collector layer 22 in the fifth embodiment are similar to those in the second embodiment. In order to reduce the collector resistance, preferably, the doping concentration and the thickness of the first collector layer 224 are substantially the same as the doping concentration and the thickness of the sub-collector layer 21. For example, the doping concentration of the first collector layer 224 is preferably set to $1 \times 10^{18}$ $cm^{-3}$ or more and $5 \times 10^{18}$ $cm^{-3}$ or less (i.e., from $1 \times 10^{18}$ $cm^{-3}$ or more and $5 \times 10^{18}$ $cm^{-3}$), and the thickness of the first collector layer 224 is preferably set to 200 nm or more and 900 nm or less (i.e., from 200 nm to 900 nm).

In order to achieve advantageous effects that are the same as or similar to those of the second embodiment, the thickness of the second collector layer 225 is preferably set to 100 nm or more and 300 nm or less (i.e., from 100 nm to 300 nm), and the doping concentration of the second collector layer 225 is preferably set to $3 \times 10^{16}$ $cm^{-3}$ or more and $7 \times 10^{16}$ $cm^{-3}$ or less (i.e., from $3 \times 10^{16}$ $cm^{-3}$ to $7 \times 10^{16}$ $cm^{-3}$). Furthermore, the thickness of the third collector layer 226 is preferably set to 100 nm or more and 300 nm or less (i.e., from 100 nm to 300 nm), and the doping concentration of the third collector layer 226 is preferably set to $1 \times 10^{16}$ $cm^{-3}$ or more and $4 \times 10^{16}$ $cm^{-3}$ or less (i.e., from $1 \times 10^{16}$ $cm^{-3}$ to $4 \times 10^{16}$ $cm^{-3}$). Furthermore, the thickness of the fourth collector layer 227 is preferably set to 300 nm or more and 500 nm or less (i.e., from 300 nm to 500 nm), and the doping concentration of the fourth collector layer 227 is preferably set to $3 \times 10^{15}$ $cm^{-3}$ or less. In addition, the fourth collector layer 227 may be made of p-type InGaAsP having a p-type dopant concentration of $1 \times 10^{15}$ $cm^{-3}$ or less or undoped InGaAsP.

In the HBT according to the fifth embodiment, the use of InP-based semiconductors, which have high electron saturation velocities, enables radio-frequency characteristics to be improved compared with the HBT according to the second embodiment. For example, the cutoff frequency ft can be improved.

Modification of Fifth Embodiment

Next, HBTs according to modifications of the fifth embodiment will be described.

In the fifth embodiment, the interface between the graded semiconductor layer made of InGaAsP and the uniform composition layer made of InGaAsP coincides with the interface at which the doping concentration discontinuously changes (the interface between the third collector layer 226 and the fourth collector layer 227). However, these two interfaces need not coincide with each other. As shown by dashed lines DL1 in FIG. 14, the interface between the graded semiconductor layer and the uniform composition layer may be disposed inside the fourth collector layer 227. Alternatively, as shown by dashed lines DL2, the interface between the graded semiconductor layer and the uniform composition layer may be disposed inside the third collector layer 226.

The embodiments described above are exemplary, and, needless to say, a partial replacement or combination of configurations described in different embodiments is possible. The same or similar advantageous effects achieved by the same or similar configurations in a plurality of embodiments will not be mentioned in each of the embodiments. Furthermore, the present disclosure is not limited to the embodiments described above. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A heterojunction bipolar transistor comprising:
    a collector layer, a base layer, and an emitter layer that are stacked on a substrate, wherein
    the collector layer includes a graded semiconductor layer in which an electron affinity increases from a side closer to the base layer toward a side farther from the base layer,
    an electron affinity of the base layer at an interface closer to the collector layer is equal to an electron affinity of the graded semiconductor layer at an interface closer to the base layer,
    the collector layer includes a first portion, which is a portion closer to the base layer, and a second portion, which is a remaining portion farther from the base layer, and
    a doping concentration of the first portion is lower than a doping concentration of the second portion.

2. The heterojunction bipolar transistor according to claim 1, wherein
    an electron affinity of the base layer increases from an interface closer to the emitter layer toward the interface closer to the collector layer.

3. The heterojunction bipolar transistor according to claim 2, wherein
    the first portion is made of at least one semiconductor selected from the group consisting of n-type semiconductors having a doping concentration of $3\times10^{15}$ cm$^{-3}$ or less, p-type semiconductors having a doping concentration of $1\times10^{15}$ cm$^{-3}$ or less, and intrinsic semiconductors.

4. The heterojunction bipolar transistor according to claim 3, wherein
    the second portion includes a third portion which is a portion closer to the first portion and a fourth portion which is a remaining portion farther from the first portion, and
    a doping concentration of the third portion is lower than a doping concentration of the fourth portion.

5. The heterojunction bipolar transistor according to claim 2, wherein
    the second portion includes a third portion which is a portion closer to the first portion and a fourth portion which is a remaining portion farther from the first portion, and
    a doping concentration of the third portion is lower than a doping concentration of the fourth portion.

6. The heterojunction bipolar transistor according to claim 5, further comprising:
    a sub-collector layer made of an n-type semiconductor, disposed on the substrate, and functioning as a path through which a current flows into the collector layer, wherein
    the collector layer is disposed on the sub-collector layer, and
    each of the doping concentrations of the first portion and the third portion is $\frac{1}{10}$ or less of a doping concentration of the sub-collector layer.

7. The heterojunction bipolar transistor according to claim 2, wherein
    the base layer is made of AlGaAs, and
    an AlAs mixed-crystal ratio of the base layer decreases from the interface closer to the emitter layer toward the interface closer to the collector layer.

8. The heterojunction bipolar transistor according to claim 7, wherein
    the first portion is made of at least one semiconductor selected from the group consisting of n-type semiconductors having a doping concentration of $3\times10^{15}$ cm$^{-3}$ or less, p-type semiconductors having a doping concentration of $1\times10^{15}$ cm$^{3}$ or less, and intrinsic semiconductors.

9. The heterojunction bipolar transistor according to claim 8, wherein
    the second portion includes a third portion which is a portion closer to the first portion and a fourth portion which is a remaining portion farther from the first portion, and
    a doping concentration of the third portion is lower than a doping concentration of the fourth portion.

10. The heterojunction bipolar transistor according to claim 7, wherein
    the second portion includes a third portion which is a portion closer to the first portion and a fourth portion which is a remaining portion farther from the first portion, and
    a doping concentration of the third portion is lower than a doping concentration of the fourth portion.

11. The heterojunction bipolar transistor according to claim 10, further comprising:
    a sub-collector layer made of an n-type semiconductor, disposed on the substrate, and functioning as a path through which a current flows into the collector layer, wherein
    the collector layer is disposed on the sub-collector layer, and
    each of the doping concentrations of the first portion and the third portion is $\frac{1}{10}$ or less of a doping concentration of the sub-collector layer.

12. The heterojunction bipolar transistor according to claim 1, wherein
    the first portion is made of at least one semiconductor selected from the group consisting of n-type semiconductors having a doping concentration of $3\times10^{15}$ cm$^{-3}$ or less, p-type semiconductors having a doping concentration of $1\times10^{15}$ cm$^{-3}$ or less, and intrinsic semiconductors.

13. The heterojunction bipolar transistor according to claim 1, wherein
the second portion includes a third portion which is a portion closer to the first portion and a fourth portion which is a remaining portion farther from the first portion, and
a doping concentration of the third portion is lower than a doping concentration of the fourth portion.

14. The heterojunction bipolar transistor according to claim 13, further comprising:
a sub-collector layer made of an n-type semiconductor, disposed on the substrate, and functioning as a path through which a current flows into the collector layer, wherein
the collector layer is disposed on the sub-collector layer, and
each of the doping concentrations of the first portion and the third portion is 1/10 or less of a doping concentration of the sub-collector layer.

15. The heterojunction bipolar transistor according to claim 14, wherein
the doping concentration of the fourth portion is from 0.5 times to 1.5 times the doping concentration of the sub-collector layer.

16. The heterojunction bipolar transistor according to claim 1, wherein
the second portion includes a third portion which is a portion closer to the first portion and a fourth portion which is a remaining portion farther from the first portion, and
a doping concentration of the third portion is lower than a doping concentration of the fourth portion.

17. The heterojunction bipolar transistor according to claim 16, further comprising:
a sub-collector layer made of an n-type semiconductor, disposed on the substrate, and functioning as a path through which a current flows into the collector layer, wherein
the collector layer is disposed on the sub-collector layer, and
each of the doping concentrations of the first portion and the third portion is 1/10 or less of a doping concentration of the sub-collector layer.

* * * * *